United States Patent
Yamauchi

(10) Patent No.: US 10,580,752 B2
(45) Date of Patent: Mar. 3, 2020

(54) METHOD FOR BONDING SUBSTRATES TOGETHER, AND SUBSTRATE BONDING DEVICE

(71) Applicant: BONDTECH CO., LTD., Kyoto-shi, Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 293 days.

(21) Appl. No.: 15/519,542

(22) PCT Filed: Oct. 19, 2015

(86) PCT No.: PCT/JP2015/079446
§ 371 (c)(1),
(2) Date: Apr. 15, 2017

(87) PCT Pub. No.: WO2016/060274
PCT Pub. Date: Apr. 21, 2016

(65) Prior Publication Data
US 2017/0221856 A1  Aug. 3, 2017

(30) Foreign Application Priority Data

Oct. 17, 2014 (JP) ................................ 2014-212173
Jul. 16, 2015 (JP) ................................ 2015-142346

(51) Int. Cl.
*B32B 41/00* (2006.01)
*H01L 23/00* (2006.01)
(Continued)

(52) U.S. Cl.
CPC ............ *H01L 24/83* (2013.01); *B23K 20/023* (2013.01); *B23K 20/233* (2013.01); *B23K 20/24* (2013.01);
(Continued)

(58) Field of Classification Search
CPC ... H01L 24/83; H01L 24/80; H01L 21/68735; H01L 23/544; H01L 21/67092;
(Continued)

(56) References Cited

U.S. PATENT DOCUMENTS 7,682,933 B1    3/2010 Loomis
2013/0256824 A1  10/2013 Mizuta et al.
(Continued)

FOREIGN PATENT DOCUMENTS

JP    2005-142537      6/2005
JP    2008-258426 A   10/2008
(Continued)

OTHER PUBLICATIONS

Japanese Office Action, dated May 15, 2018.
Extended European Search Report dated May 7, 2018.

*Primary Examiner* — Michael N Orlando
*Assistant Examiner* — Joshel Rivera
(74) *Attorney, Agent, or Firm* — Aslan Law, P.C.

(57) ABSTRACT

A production of voids between substrates is prevented when the substrates are bonded together, and the substrates are bonded together at a high positional precision while suppressing a strain. A method for bonding a first substrate and a second substrate includes a step of performing hydrophilization treatment to cause water or an OH containing substance to adhere to bonding surface of the first substrate and the bonding surface of the second substrate, a step of disposing the first substrate and the second substrate with the respective bonding surfaces facing each other, and bowing the first substrate in such a way that a central portion of the bonding surface protrudes toward the second substrate side relative to an outer circumferential portion of the bonding surface, a step of abutting the bonding surface of the first substrate with the bonding surface of the second substrate at the respective central portions, and a step of abutting the
(Continued)

bonding surface of the first substrate with the bonding surface of the second substrate across the entirety of the bonding surfaces, decreasing a distance between the outer circumferential portion of the first substrate and an outer circumferential portion of the second substrate with the respective central portions abutting each other at a pressure that maintains a non-bonded condition.

23 Claims, 15 Drawing Sheets

(51) Int. Cl.

| | | |
|---|---|---|
| *H01L 21/68* | (2006.01) | |
| *B23K 20/24* | (2006.01) | |
| *B23K 37/047* | (2006.01) | |
| *H01L 21/67* | (2006.01) | |
| *H01L 21/687* | (2006.01) | |
| *H01L 21/18* | (2006.01) | |
| *H01L 23/544* | (2006.01) | |
| *B23K 20/233* | (2006.01) | |
| *B23K 37/04* | (2006.01) | |
| *B23K 20/02* | (2006.01) | |
| *H01L 21/683* | (2006.01) | |
| *B23K 103/00* | (2006.01) | |
| *B23K 101/40* | (2006.01) | |

(52) U.S. Cl.
CPC ........ *B23K 37/047* (2013.01); *B23K 37/0408* (2013.01); *H01L 21/187* (2013.01); *H01L 21/67092* (2013.01); *H01L 21/67259* (2013.01); *H01L 21/68* (2013.01); *H01L 21/6831* (2013.01); *H01L 21/6838* (2013.01); *H01L 21/68735* (2013.01); *H01L 23/544* (2013.01); *H01L 24/75* (2013.01); *H01L 24/80* (2013.01); *H01L 24/94* (2013.01); *B23K 2101/40* (2018.08); *B23K 2103/50* (2018.08); *H01L 2223/54426* (2013.01); *H01L 2224/08145* (2013.01); *H01L 2224/08146* (2013.01); *H01L 2224/7501* (2013.01); *H01L 2224/757* (2013.01); *H01L 2224/759* (2013.01); *H01L 2224/7592* (2013.01); *H01L 2224/75102* (2013.01); *H01L 2224/75251* (2013.01); *H01L 2224/75252* (2013.01); *H01L 2224/75272* (2013.01); *H01L 2224/75303* (2013.01); *H01L 2224/75305* (2013.01); *H01L 2224/75701* (2013.01); *H01L 2224/75702* (2013.01); *H01L 2224/75704* (2013.01); *H01L 2224/75705* (2013.01); *H01L 2224/75724* (2013.01); *H01L 2224/75725* (2013.01); *H01L 2224/75744* (2013.01); *H01L 2224/75745* (2013.01); *H01L 2224/75753* (2013.01); *H01L 2224/75901* (2013.01); *H01L 2224/75981* (2013.01); *H01L 2224/8003* (2013.01); *H01L 2224/8009* (2013.01); *H01L 2224/80012* (2013.01); *H01L 2224/8013* (2013.01); *H01L 2224/80013* (2013.01); *H01L 2224/80047* (2013.01); *H01L 2224/80132* (2013.01); *H01L 2224/80203* (2013.01); *H01L 2224/80213* (2013.01); *H01L 2224/80893* (2013.01); *H01L 2224/80895* (2013.01); *H01L 2224/80896* (2013.01); *H01L 2224/80907* (2013.01); *H01L 2224/80908* (2013.01); *H01L 2224/80986* (2013.01); *H01L 2224/83009* (2013.01); *H01L 2224/8309* (2013.01); *H01L 2224/83896* (2013.01); *H01L 2224/83908* (2013.01); *H01L 2224/94* (2013.01)

(58) Field of Classification Search
CPC . H01L 21/187; H01L 24/94; H01L 21/67259; H01L 21/6838; H01L 21/6831; H01L 24/75; H01L 21/68; H01L 2224/08146; H01L 2224/08145; H01L 2223/54426; H01L 2224/80908; H01L 2224/80213; H01L 2224/8003; H01L 2224/75725; H01L 2224/8009; H01L 2224/80203; H01L 2224/7501; H01L 2224/75704; H01L 2224/80907; H01L 2224/94; H01L 2224/75724; H01L 2224/80893; H01L 2224/75272; H01L 2224/80047; H01L 2224/75303; H01L 2224/75305; H01L 2224/75701; H01L 2224/75705; H01L 2224/75702; H01L 2224/80132; H01L 2224/8013; H01L 2224/80013; H01L 2224/80012; H01L 2224/80986; H01L 2224/80896; H01L 2224/75102; H01L 2224/75981; H01L 2224/80895; H01L 2224/7592; H01L 2224/75901; H01L 2224/75753; H01L 2224/75745; H01L 2224/83009; H01L 2224/8309; H01L 2224/83896; H01L 2224/757; H01L 2224/75744; H01L 2224/75252; H01L 2224/83908; H01L 2224/759; B23K 37/047; B23K 20/233; B23K 20/023; B23K 37/0408
USPC .......................... 156/64, 350, 351, 378, 379
See application file for complete search history.

(56) References Cited

U.S. PATENT DOCUMENTS

2014/0261960 A1   9/2014  Lin et al.
2014/0349465 A1* 11/2014  Yamamoto ............ H01L 21/187
                                              438/455

FOREIGN PATENT DOCUMENTS

| JP | 2009-043837 A | 2/2009 |
| JP | 2011-249643 | 12/2011 |
| JP | 2013-120901 A | 6/2013 |
| JP | 2013-243333 A | 12/2013 |
| JP | 2014-138136 A | 7/2014 |
| JP | 2013-258377 | 12/2016 |
| WO | WO 2012/121046 | 9/2012 |
| WO | WO 2014/156987 A1 | 10/2014 |

* cited by examiner

METHOD FOR BONDING SUBSTRATES TOGETHER, AND SUBSTRATE BONDING DEVICE

TECHNICAL FIELD

The present disclosure relates to a method for bonding substrates together, and a substrate bonding apparatus.

BACKGROUND ART

In the field of electronics, mounting technologies for bonding an electronic part with a substrate, and for bonding substrates together on which electronic circuits and electronic wirings are respectively provided are now advancing. Objects to be bonded by such mounting technologies include, on bonding surfaces, electrodes which are electrically connected to electronic circuits or the like. When the electrodes are connected together, electrical connection between the objects to be bonded is established.

There are always demands for downsizing and weight reduction with respect to electronic apparatuses. In accordance with such demands, high densification and refinement of circuit patterns for an electronic circuit, and the like, are advancing. Hence, a demand for improving the alignment precision between the objects to be bonded together is now increasing.

In order to meet such a demand, a bonding method of causing the objects to be bonded together to be in contact with each other, measuring the positional displacements of the respective objects, correcting the positional displacement and aligning both the objects, and then bonding the objects together is disclosed.

In the meantime, when the objects that are planar wafers are to be bonded together, the area of the bonding plane is large in comparison with, for example, a chip. Hence, when respective flat bonding surfaces of the planar wafers are caused to face with each other and bonded, air may be trapped in between the bonding surfaces, and thus voids may be produced. This results in a defective product.

Accordingly, a scheme of aligning wafers relative to each other, pressing the central portion of the wafer so as to be bowed toward the opposing wafer to be bonded together, and then bonding those wafers is applied. According to this scheme, with the outer circumferential portion of the wafer being held, the bonding surface of the wafer is deflected in such a way that the central portion is depressed and becomes convex toward the opposing wafer, thereby contacting the bowed portion to the opposing wafer. In this case, the bowed wafer has the convex central portion that comes in contact with the bonding surface of the opposing wafer. Subsequently, the bowed wafer is released. In this case, the bowed wafer recovers to the original planar shape, and is bonded with the opposing wafer across the entirety of the bonding surfaces.

In this case, while the bowed wafer is recovering to the original planar shape, since the bowed wafer contacts the opposing wafer in sequence from the convex central portion to the outer circumferential portion, air between the wafers is pushed out to the exterior, and thus trapped air between the respective bonding surfaces of the wafers is prevented.

SUMMARY OF INVENTION

However, after the respective wafers are aligned, while the central portion of the wafer is being depressed and bowed toward the opposing wafer to be bonded, and while the bowed wafer is being released and this wafer is recovering to the original shape, a positional displacement between those wafers may occur.

The present disclosure has been made in view of the foregoing circumstances, and an objective is to provide a method for bonding substrates together and a substrate bonding apparatus which are capable of preventing production of a void between substrates when the substrates are bonded together, and which are also capable of bonding those substrates together at a high positional precision.

The present disclosure provides a method for bonding a first substrate and a second substrate, and the method includes: a step of performing hydrophilization treatment to cause water or an OH containing substance to adhere to a bonding surface of the first substrate and a bonding surface of the second substrate; a step of disposing the first substrate and the second substrate with the respective bonding surfaces facing each other, and bowing the first substrate in such a way that a central portion of the bonding surface protrudes toward the second substrate side relative to an outer circumferential portion of the bonding surface; a step of abutting the bonding surface of the first substrate with the bonding surface of the second substrate at the respective central portions; and a step of abutting the bonding surface of the first substrate with the bonding surface of the second substrate across an entirety of the bonding surfaces, decreasing a distance between an outer circumferential portion of the first substrate and an outer circumferential portion of the second substrate with the respective central portions abutting each other at a pressure that maintains a non-bonded condition.

According to an aspect of the present disclosure, in the above bonding method, the first substrate is located below the second substrate.

According to an aspect of the present disclosure, the above bonding method further includes a step of bowing the second substrate in such a way that the central portion of the bonding surface protrudes toward the first substrate side relative to the outer circumferential portion of the bonding surface.

According to an aspect of the present disclosure, in the above bonding step, the step of abutting the bonding surface of the first substrate with the bonding surface of the second substrate across the entirety of the bonding surfaces includes abutting the bonding surface of the first substrate with the bonding surface of the second substrate across the entirety of the bonding surfaces to bond the first substrate and the second substrate, decreasing the distance between the outer circumferential portion of the first substrate and the outer circumferential portion of the second substrate with distances from bottoms of the first substrate and the second substrate to the respective central portions being maintained.

According to an aspect of the present disclosure, in the above bonding method, at least the outer circumferential portion of either one or both of the first substrate and the second substrate is held.

According to an aspect of the present disclosure, the above bonding method further includes a step of aligning the first substrate and the second substrate prior to the step of abutting the bonding surface of the first substrate with the bonding surface of the second substrate across the entirety of the bonding surfaces.

According to an aspect of the present disclosure, in the above bonding method, the step of aligning the first substrate and the second substrate includes: measuring a positional displacement between the first substrate and the second substrate, with the bonding surface of the first substrate and the bonding surface of the second substrate abutting each other at the respective central portions; adjusting a relative position between the first substrate and the second substrate so as to decrease the positional displacement between the first substrate and the second substrate when the measured positional displacement exceeds an allowable error range; and repeating the measuring of the positional displacement between the first substrate and the second substrate and the adjusting of the relative position between the first substrate and the second substrate until the positional displacement falls in the allowable error range.

According to an aspect of the present disclosure, in the above bonding method, the step of measuring the positional displacement between the first substrate and the second substrate is performed with the bonding surface of the first substrate and the bonding surface of the second substrate abutting each other at a pressure or time that maintains a non-bonded condition of the respective central portions.

According to an aspect of the present disclosure, in the above bonding method, the step of abutting the bonding surface of the first substrate with the bonding surface of the second substrate across the entirety of the bonding surfaces includes abutting the opposing bonding surfaces of the first substrate and the second substrate with each other, with either one or both of the first substrate and the second substrate being flat.

According to an aspect of the present disclosure, the above bonding method further includes a bonding step after the step of abutting the bonding surface of the first substrate with the bonding surface of the second substrate across the entirety of the bonding surfaces, wherein the bonding step includes pressing the first substrate and the second substrate against each other to bond the first substrate and the second substrate together.

According to an aspect of the present disclosure, in the above bonding method, the bonding step including heating the first substrate and the second substrate to bond the first substrate and the second substrate together.

According to an aspect of the present disclosure, the above bonding method further includes a step of performing surface activation treatment of causing particles having kinetic energy to collide with the respective bonding surfaces of the first substrate and the second substrate prior to causing the water or the OH containing substance to adhere to the bonding surface through the hydrophilization treatment.

According to an aspect of the present disclosure, in the above bonding method, prior to causing the water or the OH containing substance to adhere to the bonding surface through the hydrophilization treatment, surface activation treatment is performed on the respective bonding surfaces of the first substrate and the second substrate by plasma treatment or irradiation from a fast atom beam source or an ion beam source.

According to an aspect of the present disclosure, in the above bonding method, the hydrophilization treatment is performed by adherence of gaseous water to the bonding surface.

According to an aspect of the present disclosure, in the above bonding method, the hydrophilization treatment is performed under a vacuum condition, and the water or the OH containing substance is stuck on the bonding surface without an exposure to the atmosphere.

According to an aspect of the present disclosure, the above bonding method further includes, prior to the step of aligning the first substrate and the second substrate, a step of bowing the second substrate in such a way that the central portion of the bonding surface protrudes toward the first substrate side relative to the outer circumferential portion of the bonding surface.

According to an aspect of the present disclosure, the above bonding method further includes, prior to releasing of the bowed first substrate, a step of drawing a vacuum in the atmosphere surrounding the first substrate and around the second substrate.

The present disclosure provides a substrate bonding apparatus that includes: a first substrate holder that holds a first substrate; a second substrate holder that holds a second substrate with a bonding surface of the second substrate facing a bonding surface of the first substrate; hydrophilization treatment means that causes water or an OH containing substance to adhere to the respective bonding surfaces of the first substrate and the second substrate; a first protruding mechanism that bows the first substrate in such a way that a central portion of the bonding surface protrudes toward the second substrate side relative to an outer circumferential portion of the bonding surface; and a controller, wherein the controller causes the bonding surface of the bowed first substrate and the bonding surface of the second substrate to abut each other with the first substrate being bowed by the first protruding mechanism in such a way that the central portion protrudes relative to the outer circumferential portion of the bonding surface, and causes the bonding surface of the first substrate and the bonding surface of the second substrate to abut each other across the entirety of the bonding surfaces, decreasing a distance between an outer circumferential portion of the first substrate and an outer circumferential portion of the second substrate with the respective central portions abutting each other at a pressure that maintains a non-bonded condition.

According to an aspect of the present disclosure, in the above bonding apparatus, the first substrate holder is located below the second substrate holder.

According to an aspect of the present disclosure, the above bonding apparatus further includes a second protruding mechanism that bows the second substrate in such a way that the central portion of the bonding surface protrudes toward the first substrate side relative to the outer circumferential portion of the bonding surface, wherein the second substrate is bowed in such a way that the central portion protrudes toward the first substrate side relative to the outer circumferential portion of the bonding surface.

According to an aspect of the present disclosure, in the above bonding apparatus, with distances from bottoms of the first substrate and the second substrate to the respective central portions being maintained, the distance between the outer circumferential portion of the first substrate and the outer circumferential portion of the second substrate is decreased to abut the bonding surface of the first substrate with the bonding surface of the second substrate across the entirety of the bonding surfaces.

According to an aspect of the present disclosure, in the above bonding apparatus, the one protruding mechanism is subjected to a pressure control, while the other protruding mechanism is an actuator that has a numerically-controlled protruding distance.

According to an aspect of the present disclosure, in the above bonding apparatus, the first substrate holder or the second substrate holder further comprises either one or both of a first substrate holder mechanism that holds the first substrate and a second substrate holder mechanism that holds the second substrate.

According to an aspect of the present disclosure, in the above bonding apparatus, the first substrate holder mechanism or the second substrate holder mechanism holds only the outer circumferential portion of the substrate.

According to an aspect of the present disclosure, in the above bonding apparatus, the first substrate holder mechanism or the second substrate holder mechanism is an electrostatic chuck.

According to an aspect of the present disclosure, in the above bonding apparatus, the first substrate holder mechanism or the second substrate holder mechanism is a vacuum suction type, and a suction groove of the substrate holder to hold a circumference portion of the substrate is separate from a suction groove to hold the central portion of the substrate.

According to an aspect of the present disclosure, the above bonding apparatus further includes an alignment unit that aligns the first substrate and the second substrate, wherein the alignment unit aligns the first substrate and the second substrate before the bonding surface of the first substrate and the bonding surface of the second substrate abut each other across the entirety of the bonding surfaces to be bonded together.

According to an aspect of the present disclosure, in the above bonding apparatus, the first substrate holder further comprises a pressing member that forms a holding surface to hold the first substrate and that is bowed by the protruding mechanism in such a way that a central portion protrudes toward the second substrate side.

According to an aspect of the present disclosure, the above bonding apparatus further includes a chamber in which a vacuum is drawn in the atmosphere around the first substrate and around the second substrate.

According to an aspect of the present disclosure, in the above bonding apparatus, the alignment unit: measures a positional displacement between the first substrate and the second substrate, with the bonding surface of the first substrate and the bonding surface of the second substrate abutting each other at the respective central portions; adjusts a relative position between the first substrate and the second substrate so as to reduce the positional displacement between the first substrate and the second substrate when the measured positional displacement exceeds an allowable error range; and repeats the measuring of the positional displacement between the first substrate and the second substrate and the adjusting of the relative position between the first substrate and the second substrate until the positional displacement falls in the allowable error range.

According to an aspect of the present disclosure, in the above bonding apparatus, when the bonding surface of the first substrate and the bonding surface of the second substrate are to abut each other across the entirety of the bonding surfaces, the opposing bonding surfaces of the first substrate and the second substrate abut each other with either one or both of the first substrate and the second substrate being flat.

According to the present disclosure, a production of a void between wafers is prevented, and a strain is suppressed, thereby enabling a bonding at a high positional precision.

DESCRIPTION OF EMBODIMENTS

An explanation will be given below of, with reference to the accompanying figures, a method for bonding substrates together, and a substrate bonding apparatus according to an embodiment based on those figures.

Figure 1:
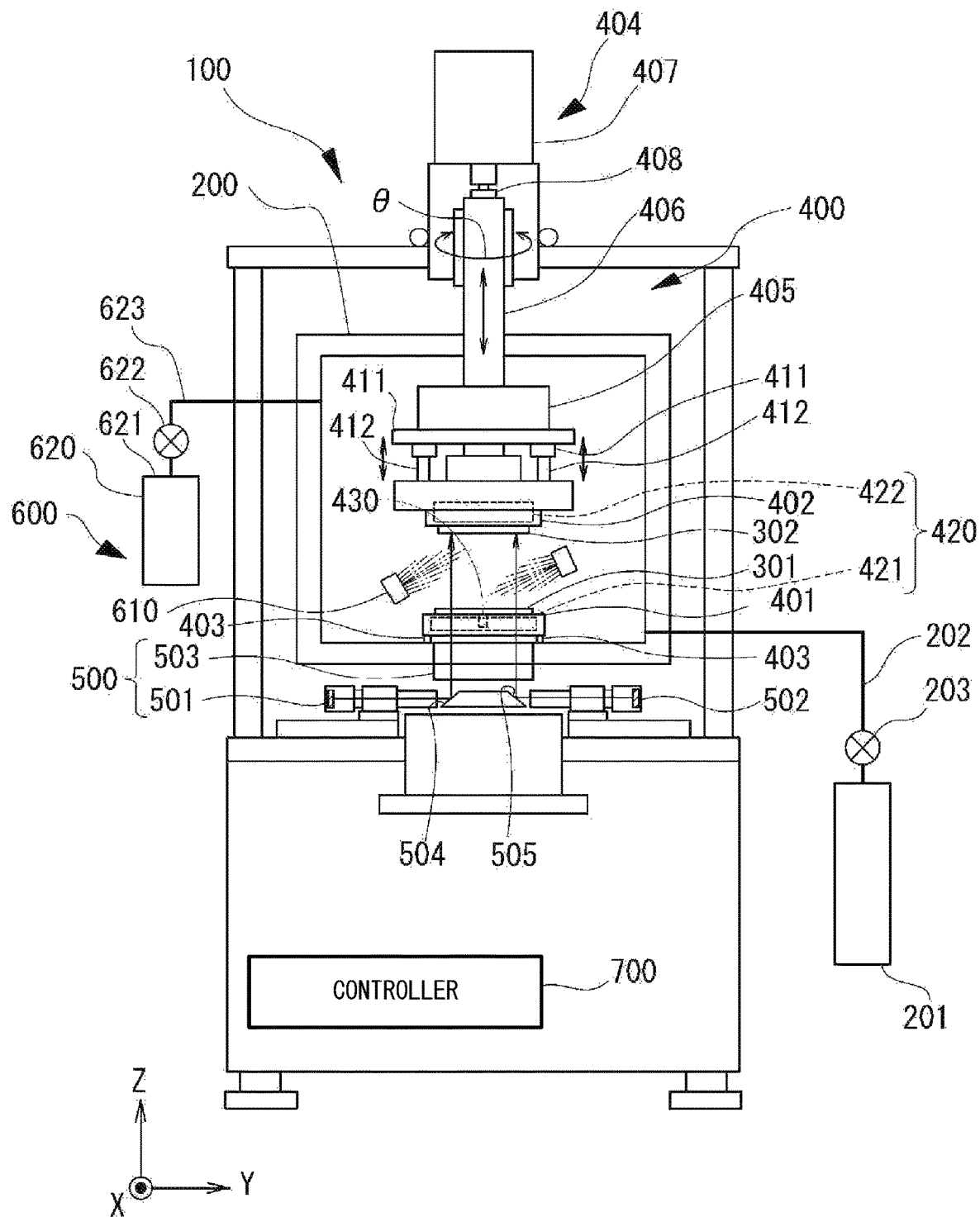
FIG. 1 is a schematic front view illustrating a general internal structure of a substrate bonding apparatus according to an embodiment of the present disclosure.
Figure 2:
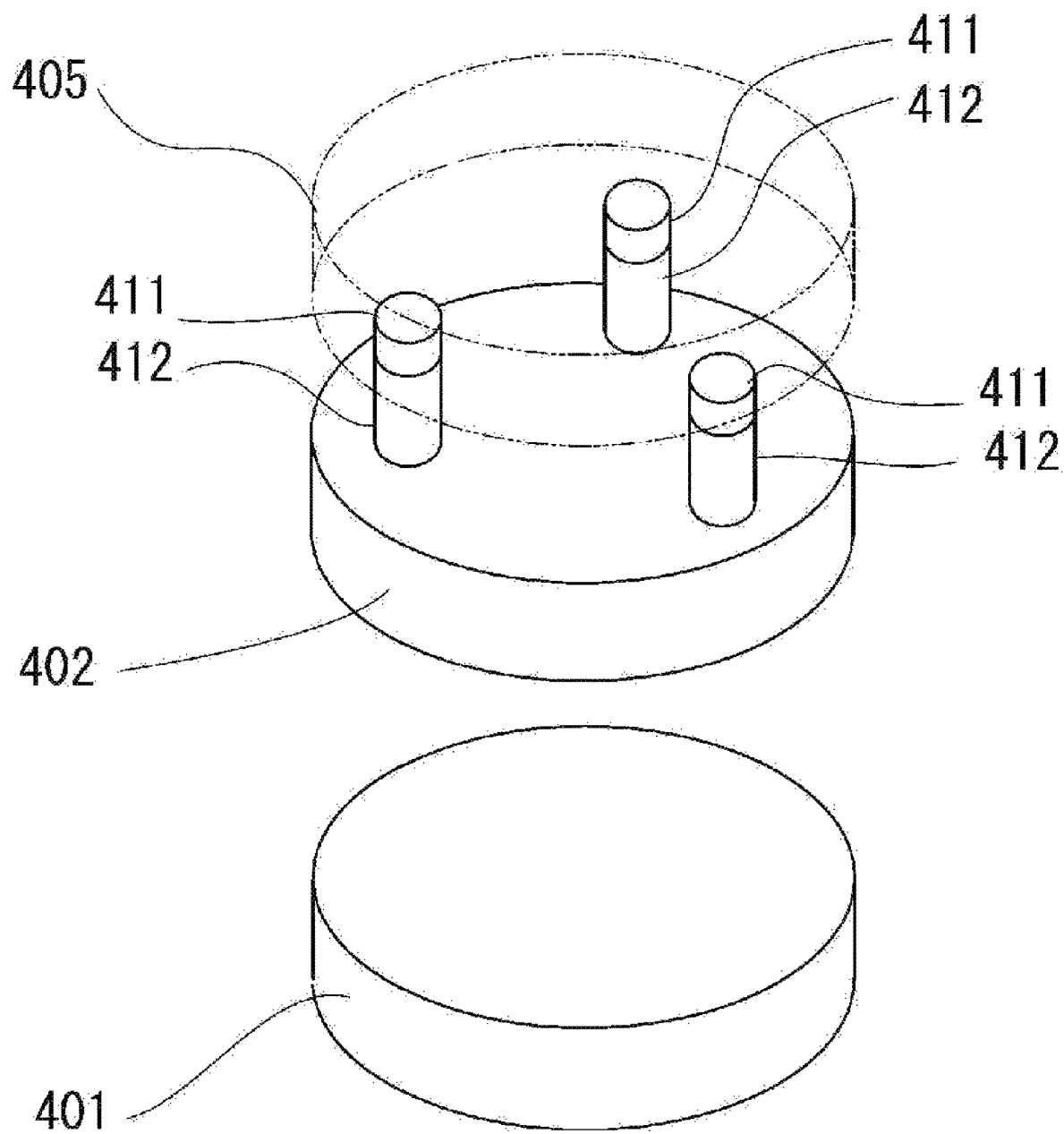
FIG. 2 is a schematic perspective view illustrating a stage and the proximity of a head.
Figure 3:
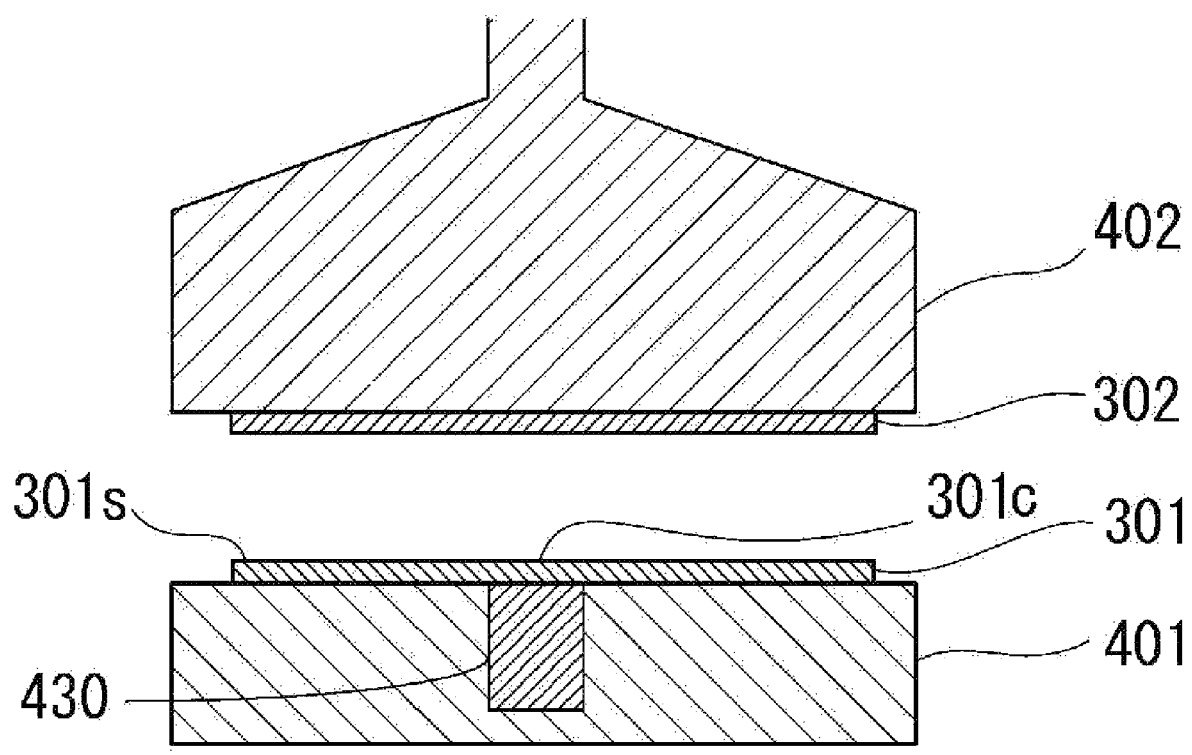
FIG. 3 is a schematic front cross-sectional view illustrating a structure of the stage that is holding a substrate.
Figure 4:
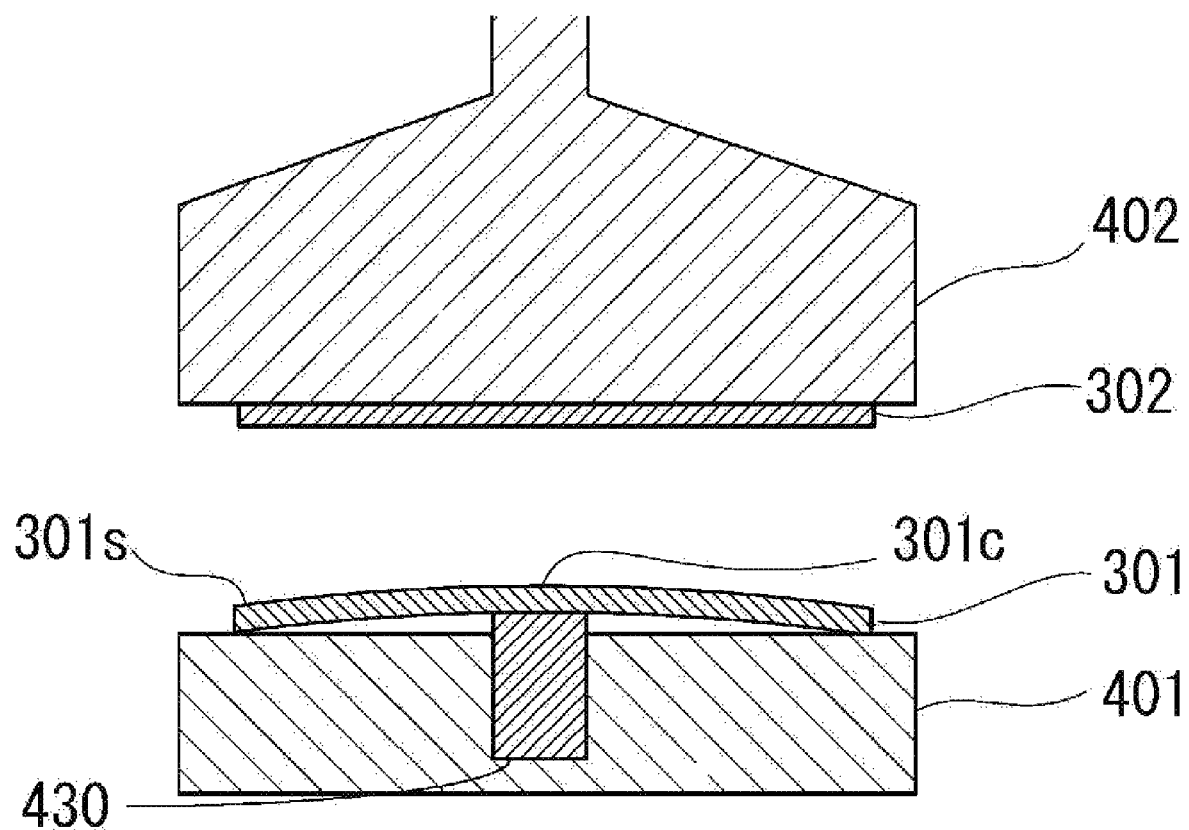
FIG. 4 is a schematic front cross-sectional view illustrating a condition in which the substrate is bowed by a protruding mechanism provided in the stage.
Figure 5:
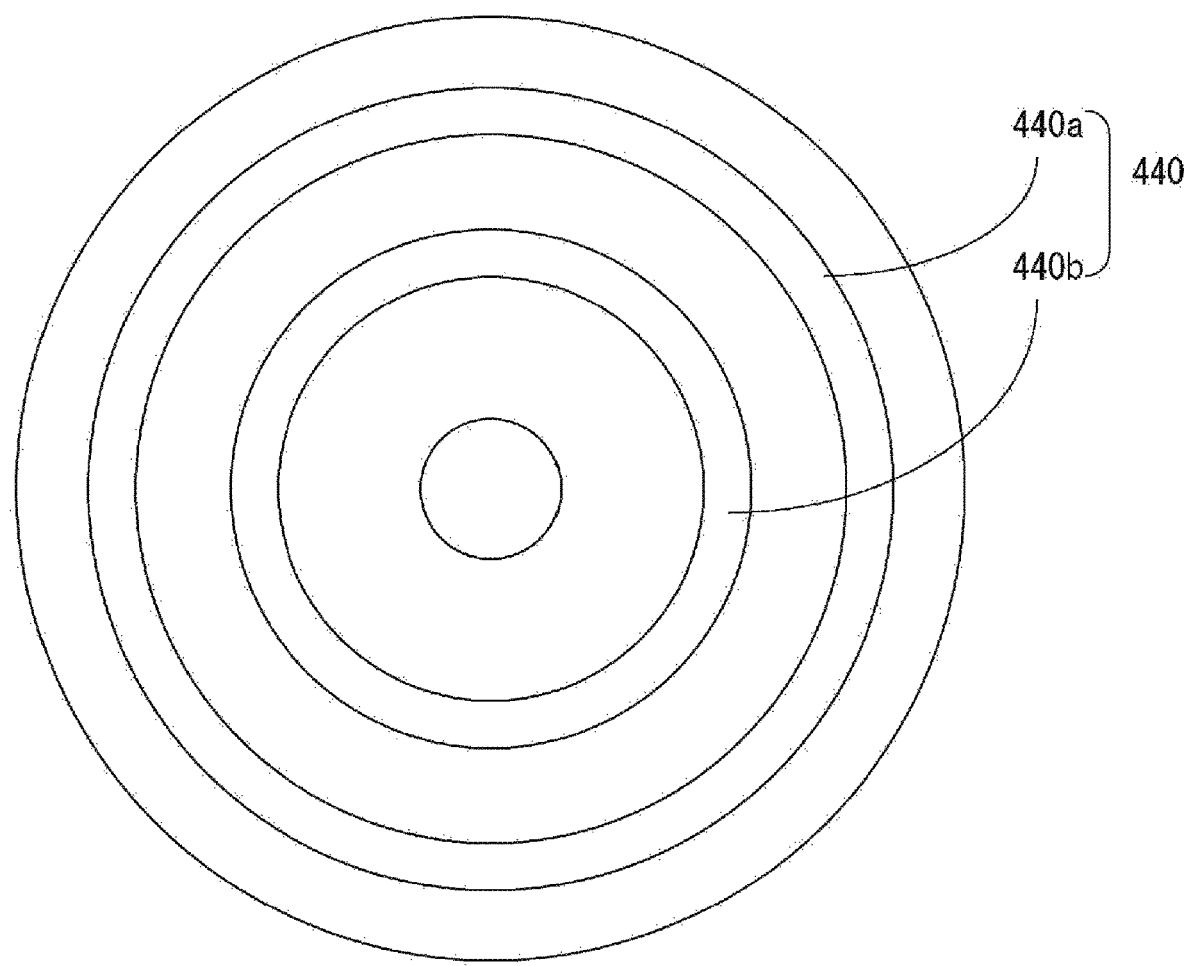
FIG. 5 is a schematic front view illustrating a structure of a holder mechanism of the stage.

FIG. 1 is a front view illustrating a general internal structure of a substrate bonding apparatus 100 according to an embodiment of the present disclosure. FIG. 2 is a schematic perspective view illustrating a stage and the proximity of a head. FIG. 3 is a front cross-sectional view illustrating a structure of the stage that is holding a substrate. FIG. 4 is a front cross-sectional view illustrating a condition in which a substrate is bowed by a protruding mechanism provided in the stage. FIG. 5 is a front cross-sectional view of another example protruding mechanism. In order to clarify the following explanation, directions, and the like, are indicated with reference to an XYZ orthogonal coordinate system as appropriate.

As illustrated in FIG. 1, the substrate bonding apparatus 100 includes a chamber 200, substrate supporting means 400 that supports objects to be bonded together which are a substrate (second substrate) 301, and a substrate (first substrate) 302 so as to face with each other, position measuring means (alignment unit) 500 that measures the relative positional relationship between the substrates 301, 302, hydrophilization treatment means 600 that performs surface activation treatment on the respective surfaces of the substrates 301, 302 supported so as to face with each other, and a controller (control unit) 700 that controls the action of each component in the substrate bonding apparatus 100.

<Chamber>

The chamber 200 is in a hollow box shape, and stages 401, 402 that are the substrate supporting means 400 to be explained later, and the like, are provided therein.

The chamber 200 includes a vacuum pump 201 as vacuuming means to vacuum the chamber interior. The vacuum pump 201 is connected to the chamber 200 via a discharging pipe 202. The discharging pipe 202 is provided with a discharging valve 203 that opens and closes the discharging pipe 202.

Such a chamber 200 discharges the gas therein via the discharging pipe 202 upon opening the discharging pipe 202 and actuating the vacuum pump 201. Hence, the interior of the chamber 200 is depressurized and vacuumed, and thus the internal atmosphere of the chamber 200 becomes a vacuum or low pressure condition. In addition, the discharging valve 203 adjusts the discharging flow rate through the discharging pipe 202 by changing the opened and closed amount, thereby adjusting the interior of the chamber 200 to be a designated vacuum degree.

<Substrate Supporting Means>

The substrate supporting means 400 includes the stage (second substrate holder) 401 and the stage (first substrate holder) 402 that support the substrates 301, 302, respectively, stage driving mechanisms 403, 404 that move the respective stages, and heating means 420 that heats the substrates.

The stages 401, 402 are provided so as to face with each other in the vertical direction (Z direction). The lower stage 401 has the upper surface that serves as the supporting surface for the substrate 301. The upper stage 402 has the lower surface that serves as the supporting surface of the substrate 302. Those stages 401, 402 are disposed so as to have the respective supporting surfaces in parallel with each other.

The stages 401, 402 may have, on the respective supporting surfaces, a holder mechanism, such as a mechanical chuck, an electrostatic chuck, or a vacuum chuck. This holder mechanism can change the state between a fastening state to fasten the substrates 301, 302 on the supporting surfaces and a release state to release the fastened substrates 301, 302 from the respective supporting surfaces.

The lower stage 401 includes the stage driving mechanism 403. The stage driving mechanism 403 moves the lower stage 401 in the X, Y, and θ directions within a horizontal plane orthogonal to the vertical direction (Z direction) in which the stage 401 and the stage 402 face with each other.

The upper stage 402 includes the stage driving mechanism 404 that has a Z-direction moving up-and-down driving mechanism 406, and a Z-axis rotation driving mechanism 407. The stage driving mechanism 404 may further include an X-Y direction driving mechanism 405.

The Z-direction moving up-and-down driving mechanism 406 moves the stage 402 in the Z direction, thereby causing the stages 401, 402 to come close to or apart from each other along the Z direction. In addition, the Z-direction moving up-and-down mechanism 406 causes both the stages 401, 402 to come close to each other so as to bring the respective opposing bonding surfaces of the held substrates 301, 302 to be in contact with each other, and then can press the substrates 301, 302 that are in contact with each other.

The Z-direction moving up-and-down driving mechanism 406 is provided with a pressure sensor 408 that measures force applied along the Z-axis. The pressure sensor 408 detects pressure to be applied to the bonding surfaces of the substrates 301, 302 depressed against each other by the Z-direction moving up-and-down driving mechanism 406. An example pressure sensor 408 is a load cell.

With the respective central portions of the substrates 301, 302 being abutted with each other by pressure that maintains a non-bonded condition by the Z-direction moving up-and-down driving mechanism 406, or with the distance between the respective central portions of the substrates 301, 302 being maintained, the distance between the outer circumferential portion of the substrate 301 and that of the substrate 302 is reduced, and thus the bonding surface of the substrate 301 and that of the substrate 302 are moved so as to abut with each other across the entirety of the bonding surfaces.

The X-Y direction driving mechanism 405 slides and moves the stage 402 in the X and Y directions orthogonal to the Z direction in which the stage 401 and the stage 402 face with each other.

As illustrated in FIG. 1 and FIG. 2, provided between the X-Y direction driving mechanism 405 and the stage 402 are multiple, for example, three protruding mechanisms 412 near the outer circumferential portion of the stage 402 at a pitch in the circumferential direction. Each protruding mechanism 412 is independently driven so as to be elongated and contracted in the Z direction. Those protruding mechanisms 412 precisely or correctly adjust the distribution of force or pressure applied to the bonding surfaces of the respective substrates 301, 302.

In addition, provided between each protruding mechanism 412 and the X-Y driving mechanism 405 is a stage pressure sensor 411.

The protruding mechanism 412 has the action to be controlled by an unillustrated control unit in accordance with the distribution of force or pressure applied to the bonding surfaces of respective the substrates 301, 302 measured by the multiple stage pressure sensors 411.

Those stage pressure sensors 411 and protruding mechanisms 412 further precisely adjust the distribution of the pressure applied to the depressed substrates 301, 302 against each other by the Z-direction moving up-and-down driving mechanism 406, thereby making the distribution uniformly across the entirety of the bonding surfaces or obtaining a predetermined distribution.

The Z-axis rotation driving mechanism 407 is capable of rotating the stage 402 around the Z-axis. The rotation driving mechanism 407 controls a rotation position θ of the stage 402 around the Z-axis relative to the stage 401, thereby controlling the relative positions of both the substrates 301, 302 in the rotation direction.

Prior to the release of the bowed first substrate, the atmosphere around the first substrate and the second substrate within the chamber is vacuumed by the control unit, and thus both the substrates can be bonded together without trapping air therebetween and producing a void.

In the field of simultaneously bonding the extremely small electrode and a peripheral insulation layer and called hybrid bonding, the extremely small electrode formed of Cu is subjected to CMP polishing so as to be concaved inwardly, the insulation layer is bonded at a low temperature that is around 150° C., and then the Cu electrode is heated to a temperature around 350° C. so as to expand this electrode and to fill the gap, thereby diffusing and bonding Cu with each other. According to this scheme, when bonding is performed in the atmosphere, the gap between the Cu electrodes are already filled by ambient air, and thus the Cu electrode surface is oxidized during the heating and expansion procedure, which is not suitable for bonding. In addition, since there is no escape space for the trapped air in the gap, a void is produced and left.

According to the bonding apparatus of this embodiment, since the gap is vacuumed by performing the bonding in the vacuum condition, oxidization is suppressed, and a production of void is also suppressed. As for the vacuuming timing, with the respective central portions being in contact with each other, by ensuring the ambient environment, a large amount of water molecules is present at the contacting portion, enabling a correction of positional displacement, but the water molecules can be left to some level at the boundary when vacuuming is performed beforehand within a short time like within a few minutes and at a vacuum degree of several 100 Pa.

In addition, by performing the vacuuming right before the respective central portions are in contact with each other, the entire surface can be secured at the vacuum atmosphere while leaving the water molecules therebetween.

Still further, when position correction after the contact is unnecessary, vacuuming may be performed beforehand.

Yet still further, the aligning step for the first substrate and the second substrate may be performed before the bowed substrate is released, or after the vacuuming is performed. The necessary time for alignment is several seconds to several ten seconds, which does not affect the bonding of the substrates.

<Protruding Mechanism>

As illustrated in FIG. 3, in the lower stage 401, embedded in the central portion of the supporting surface that supports the substrate 301 is a protruding mechanism 430 capable of moving forward toward the upper stage 402 and being retracted therefrom.

This protruding mechanism 430 may be a cylinder mechanism or an electromagnetic mechanism. The preferable protruding mechanism 430 has a function of applying force at least capable of bowing the substrate 301, and when receiving force in the opposite direction to the protruding direction which is equal to or greater than a certain magnitude, of being retracted in the opposite direction to the protruding direction.

The protruding mechanism is capable of changing pressing force by changing air pressure to be supplied in the cylinder in the case of, for example, a cylinder mechanism.

In addition, a preferable actuator that constructs the protruding mechanism is a voice coil motor. The voice coil motor is a combination of a magnet and a coil, and can control the pressure in accordance with a current flowing through the coil and also control the position by providing, at the exterior of a motor case, a sensor that reads the position. Application of the voice coil motor enables both the pressure control and the position control by a single actuator. Hence, when, for example, the position is displaced beyond the specified level during the depress control, the depress control and the position control can be performed simultaneously so as to restrict the position within the specified range instead of the position control.

From the bowed condition, by moving the substrates on the head and the stage so as to come close to each other in the moving axis perpendicular to the substrates, for example, Z-axis in this embodiment, the protruding mechanism is pushed down, the outer circumferential portion of the substrate becomes close, and the contact area can be increased from the central portion of the substrate toward the outer circumferential portion thereof along the other flat substrate in a manner like drawing a circle.

In addition, by performing a numerical control on the distance between the substrates, a wetting spread speed can be controlled. The speed control is an effective method since the wetting spread speed varies depending on the surface activation situation, and a void may be produced if the speed is too fast according to conventional methods of fitting a pawl in between the wafers to draw out the substrate and to let the drawn substrate to fall naturally.

Still further, when both the substrates are bowed, and when the one actuator is an actuator capable of performing a numerical control, for example, a piezo actuator, by elongating and contracting the actuator together with the Z-axis movement of the head, the outer circumferential portions may become close to each other with the vertical distance between the bottom of each substrate to the central portion thereof being maintained at constant, and the contact area can be increased toward the outer circumferential portion.

In this case, when only one substrate is bowed, the alignment marking position of the one substrate is displaced inwardly, and thus the alignment precision decreases, and a strain is caused at the time of bonding. By bowing the substrates from both sides, the alignment marking positions are located at the same position, and the substrates can be bonded without a strain at the time of bonding, and thus this is an effective method in comparison with conventional one-sided protruding mechanism.

In the case the one-sided protruding mechanism, the necessary protruding amount is, for example, 20 μm, but according to the both-sided protruding mechanisms, the protruding amount can be in 10 μm for each side. This further reduces a strain. In the field of, in particular, simultaneously bonding the extremely small electrode and the peripheral insulation layer and called a hybrid bonding that needs a precision in a sub-micron order, for example, as for CMOS image sensors, memories, arithmetic processing units, and MEMSs, this is a particularly effective method.

When, after the respective central portions are in contact with each other, the both-end markings of the substrates are read by an image processing apparatus to measure a positional displacement, and moves the substrates for correction, if the water molecules are present at the boundary between both the substrates, and the pressing force is little, the substrates in a contacting condition can be moved for correction, but when the contact area is large, once the protruding mechanism may be retracted to form a gap between both the substrates, and then the substrates may be moved for correction. In addition, with the protruding mechanism remaining unchanged, the gap may be formed by a movement along the Z-axis. Still further, the gap may be provided by the combination of both schemes.

As illustrated in FIG. 4, when the protruding mechanism 430 protrudes, an outer circumferential portion 301s of the substrate 301 receives downward force by the own weight, and thus the substrate 301 is bowed in such a way that a central portion 301c is convex upwardly. When the pressing by the protruding mechanism 430 is canceled or when the substrate 301 abuts the opposing substrate 302 and receives force that is equal to or greater than a certain force, the substrate 301 recovers to an original planar shape.

Figure 8:
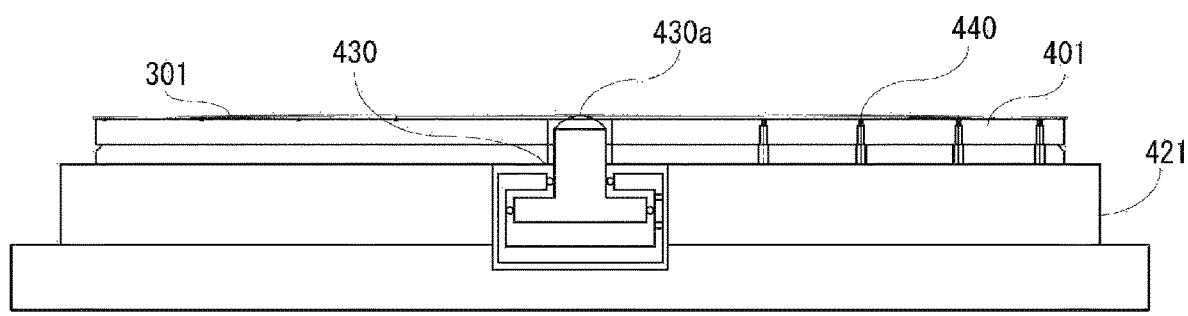
FIG. 8 is a schematic front cross-sectional view illustrating a structure of the stage and that of substrate heating means.

A head tip 430a of the protruding mechanism 430 to be in contact with the substrate may be, for example, as illustrated in FIG. 8, in a curved shape. Hence, the substrate can be bowed without applying a locally intensive force to thereto. In addition, this also suppresses the positional displacement of the substrates.

<Holder Mechanism>

The stages 401, 402 may each include a holder mechanism 440, such as a mechanical chuck, an electrostatic chuck, or a vacuum chuck, on each supporting surface. This holder mechanism can change the state between the fastening state to fasten the substrate 301, 302 on the supporting surface and the release state to release the fastened substrate 301, 302 from the supporting surface.

FIG. 5 illustrates an example holder mechanism. The holder mechanism may be provided in a divided manner in multiple regions on the surface of the stage 401, 402. In the example case illustrated in FIG. 5, two holder mechanisms that are an outer holder mechanism 440a and an inner holder mechanism 440b are provided. The outer holder mechanism 440a and the inner holder mechanism 440b can be controlled independently, and the internal holder mechanism 440b may be released while the outer holder mechanism 440a is holding the outer circumferential portion of the substrate so as to make the central portion of the substrate free from any force in the Z-axis direction.

When the multiple holder mechanisms 440 are provided, for example, holder mechanisms that have different principles and functions, such as an electrostatic chuck and a vacuum chuck, may be simultaneously adopted. For example, the electrodes of the electrostatic chucks and the suction grooves of the vacuum chucks may be provided alternately in the radial direction of the stage.

Figure 6:
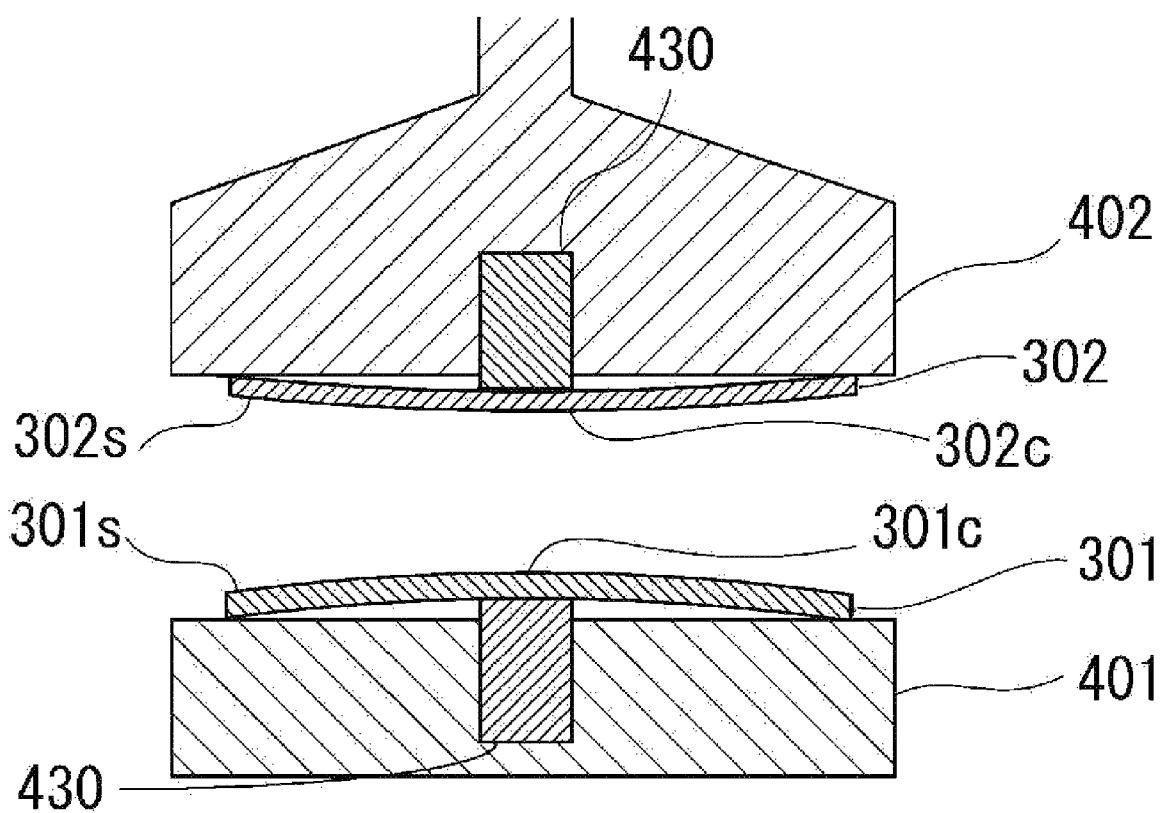
FIG. 6 is a schematic front cross-sectional view illustrating a condition in which both substrates are bowed by respective protruding mechanisms of the stages.

In addition to the above structure, the upper stage 402 may have the similar mechanism to that of the protruding mechanism 430. As illustrated in FIG. 6, by employing a structure in which the substrates 301 and 302 are bowed at both the stages 401 and 402, the bowing amount of the substrate can be reduced, which enables alignment of the substrates with less error.

When the upper substrate 302 is to be bowed, preferably, only an outer circumferential portion 302s of the substrate 302 is to be held. In this case, by holding only the outer circumferential portion 302s of the substrate 302 by the holder mechanism 440, the substrate is bowed in a desired shape even if the pressing force by the protruding mechanism 430 is not intensive, which is preferable.

In the above bonding apparatus, when the substrate holder mechanism 440 is a vacuum suction type, the suction grooves provided in the stage may be separated so as to correspond to the portions of the substrate.

For example, the suction groove that holds the circumference portion of the substrate and the suction groove that holds the central portion of the substrate may be separated from each other, and may be independently actuated. This enables only the outer circumferential portion of the substrate to be held.

In addition, the central portion may be vacuumed and sucked beforehand, and vacuum break may be caused when the substrate is to be bowed, or pressurization air may be applied for only several hundred milliseconds to facilitate a separation of the substrate. When the substrate is mirror-surface finished, and is not easy to separate, the contact surface of the holder may be made rough intentionally so as to facilitate the separation of the substrate while maintaining a height precision.

In the above bonding apparatus, when the substrate holder mechanism 440 is an electrostatic chuck type, as illustrated in FIG. 5 as an example, the holder mechanism may be divided into multiple regions on the stage 401, 402. For example, in the example case illustrated in FIG. 5, two separate patterns that are the outer holder mechanism 440a and the inner holder mechanism 440b individually controllable are provided.

The outer holder mechanism 440a and the inner holder mechanism 440b are independently controllable, the outer holder mechanism 440a may hold the outer circumferential portion of the substrate, while the inner holder mechanism 440b may be released, making the central portion of the substrate free from any force in the Z-axis direction. In addition, when the central portion is to be bowed, by simultaneously utilizing the vacuum suction groove for the central portion to cause a vacuum break and to accomplish an ambient pressure or applying pressurization air for several hundred milliseconds, a separation of the substrate may be facilitated.

Still further, the holder mechanism may be divided into three pieces, and at least one layer of groove may be provided between the central portion and the outer circumferential portion so as to provide a release layer to an ambient pressure. This enables the release layer to absorb both wetting of the outer circumferential portion and of the central portion with the vacuum holding being maintained for the outer circumferential portion while the pressurization air is applied to the central portion. This is effective since a separation of the sucked and held outer circumferential portion is prevented when air is applied to the central portion, and a failure such that the applied air is absorbed by the outer circumferential portion, disabling the central portion to be bowed is avoided.

Yet still further, the suction portion and the release portion to the ambient pressure are not limited to the grooves, and a supporting structure for a dot-by-dot manner at several portions on the surface may be employed.

Figure 7:
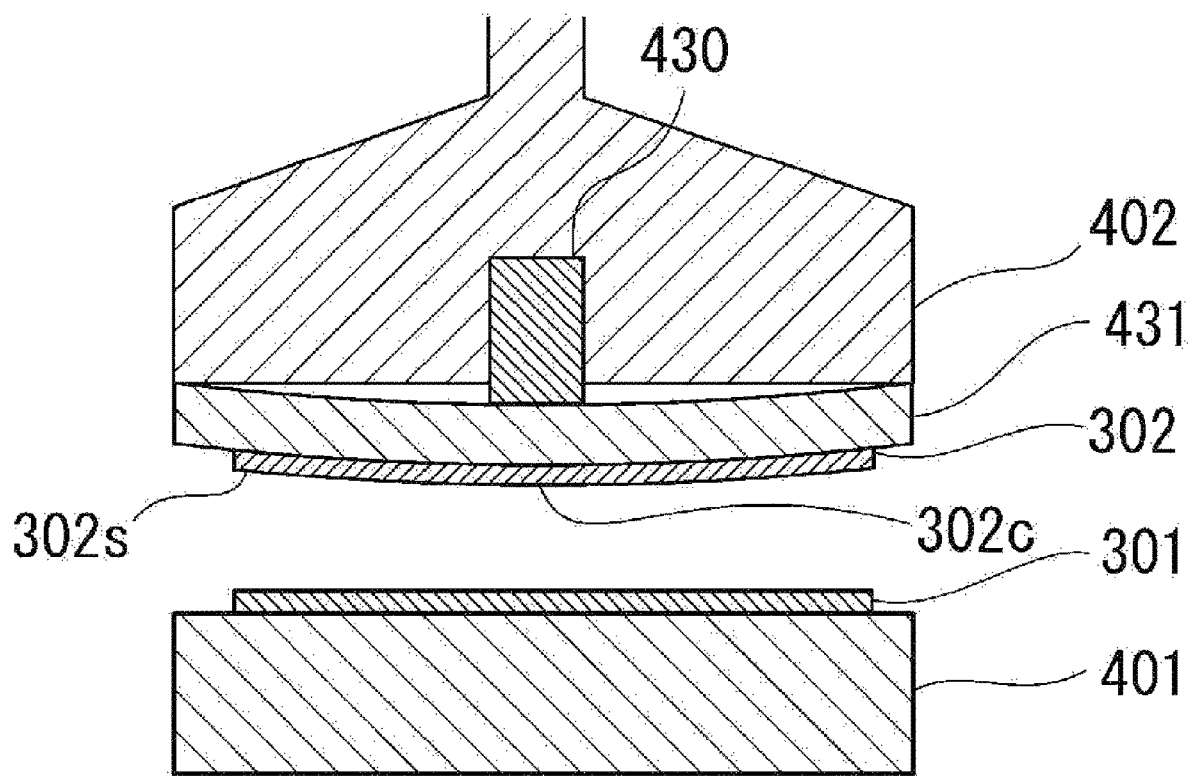
FIG. 7 is a schematic front cross-sectional view illustrating another example protruding mechanism.

In addition, as illustrated in FIG. 7, at the upper stage 402, a pressing plate 431 that is a flexible thin plate may be provided on the supporting surface that supports the substrate 302.

The pressing plate 431 may include, on the supporting surface that supports the substrate 302, a holder mechanism (unillustrated), such as a vacuum suction type, a mechanism chuck, or an electrostatic chuck.

As illustrated in FIG. 7, when the protruding mechanism 430 protrudes, the pressing plate 431 is elastically deformed, and a central portion 431c thereof is bowed so as to be convex downwardly. The bowed pressing plate 431 so as to be convex downwardly presses a central portion 302c of the substrate 302 that has the outer circumferential portion 302s held by the holder mechanism (unillustrated) toward the lower stage 401. In this case, the substrate 302 is elastically deformed along the pressing plate 431, and the central portion 302c is bowed so as to be convex downwardly relative to the outer circumferential portion 302s.

At this time, since the bowed pressing plate 431 presses the entire substrate 302 to bow the substrate, a strain of the substrate 302 is prevented. When the pressing action by the protruding mechanism 430 is released, the substrate 302 recovers to the original planar shape.

<Substrate Heating Means>

As illustrated in FIG. 1, the substrate heating means 420 includes heaters 421, 422 embedded in the stages 401, 402, respectively. The heaters 421, 422 are constructed so as to produce Joule heat by, for example, electrothermal heater. The heaters 421, 422 transfer heat via the stages 401, 402, respectively, and heat the substrates 301, 302 supported on the respective stages 401, 402. By controlling the amount of heat generated by the heaters 421, 422, the temperature of the substrate 301, 302, and that of the bonding surface can be adjusted.

The stages 401, 402 and the heaters 421, 422 may be formed of separate members. For example, the stages 401, 402 that respectively include the above holder mechanisms 440 and the heaters 421, 422 that include heater wirings, and the like, may be laid over on each other. FIG. 8 illustrates an example.

In addition, the substrates may be directly heated and bonded together using the heater of the bonding apparatus, but the substrates pasted with each other may be taken out, and may be annealed for several hours at 150° C. in a free condition from pressing over a batch furnace or a hot plate.

<Position Measuring Means>

Position measuring means 500 measures the relative positional relationship between the substrates 301, 302. The position measuring means 500 includes a window 503 formed in the chamber 200, a light source (unillustrated), multiple cameras 501, 502, and mirrors 504, 505.

Light emitted from the light source (unillustrated) reaches a portion (unillustrated) of the substrate 301, 302 where a marking is provided through the mirror 504, 505, and the window 503. The reflected light from the portion (unillustrated) of the substrate 301, 302 where the marking is provided is picked up by the camera 501, 502 through the window 503, and the mirror 504, 505.

In FIG. 1, the cameras 501, 502 each include a coaxial lighting system. The light source may be provided above the upper stage 401, or may be provided so as to emit light from the camera 501, 502 so as to travel along the optical axis of the camera. As for the light of each coaxial lighting system of the camera 501, 502, light within a wavelength range (when, for example, the substrate is formed of silicon, infrared light) that passes through the portion of the substrate 301, 302 where the marking is provided and the portions of both the stages where the light should pass through.

<Substrate Alignment>

The substrate bonding apparatus 100 is capable of measuring the relative positions of the substrates 301, 302 and of aligning those with each other using the position measuring means 500, the respective driving mechanisms 403 to 407, and the controller 700 connected thereto.

The substrates 301, 302 have respective defined portions where measurement light should pass through, the marking is given to such a portion, and some of the transmitted light is reflected, blocked or diffracted. When the camera 501, 502 receives the transmitted light, a dark marking appears within the picked-up image that is a blight field image. Alternatively, when reflected light from the marking is received, a bright marking appears in the dark image. Preferably, the multiple markings are provided on the substrate, for example, provided at two opposing corners of the substrate. Hence, based on the positions of the multiple markings, the absolute position of the substrate 301 or 302 can be identified.

Preferably, corresponding markings are provided at the corresponding portions of the substrates 301, 302 to each other, for example, the positions to be laid over in the Z direction at the time of bonding. The markings of both the substrates 301, 302 are observed within the same field of view, and the relative displacements in the X direction and in the Y direction are measured. By measuring the relative displacements in the X direction and in the Y direction at the multiple locations, the relative positional displacements ($\Delta X$, $\Delta Y$, $\Delta \theta$) of the substrates 301, 302 in the X direction, in the Y direction, and in the $\theta$ direction are calculatable.

The measurement action by the position measuring means 500 for the positional displacement can be executed for the substrates 301, 302 in both of the non-contacting condition and the contacting condition.

<Relative Position Measurement of Substrates Using Markings>

Figure 9:
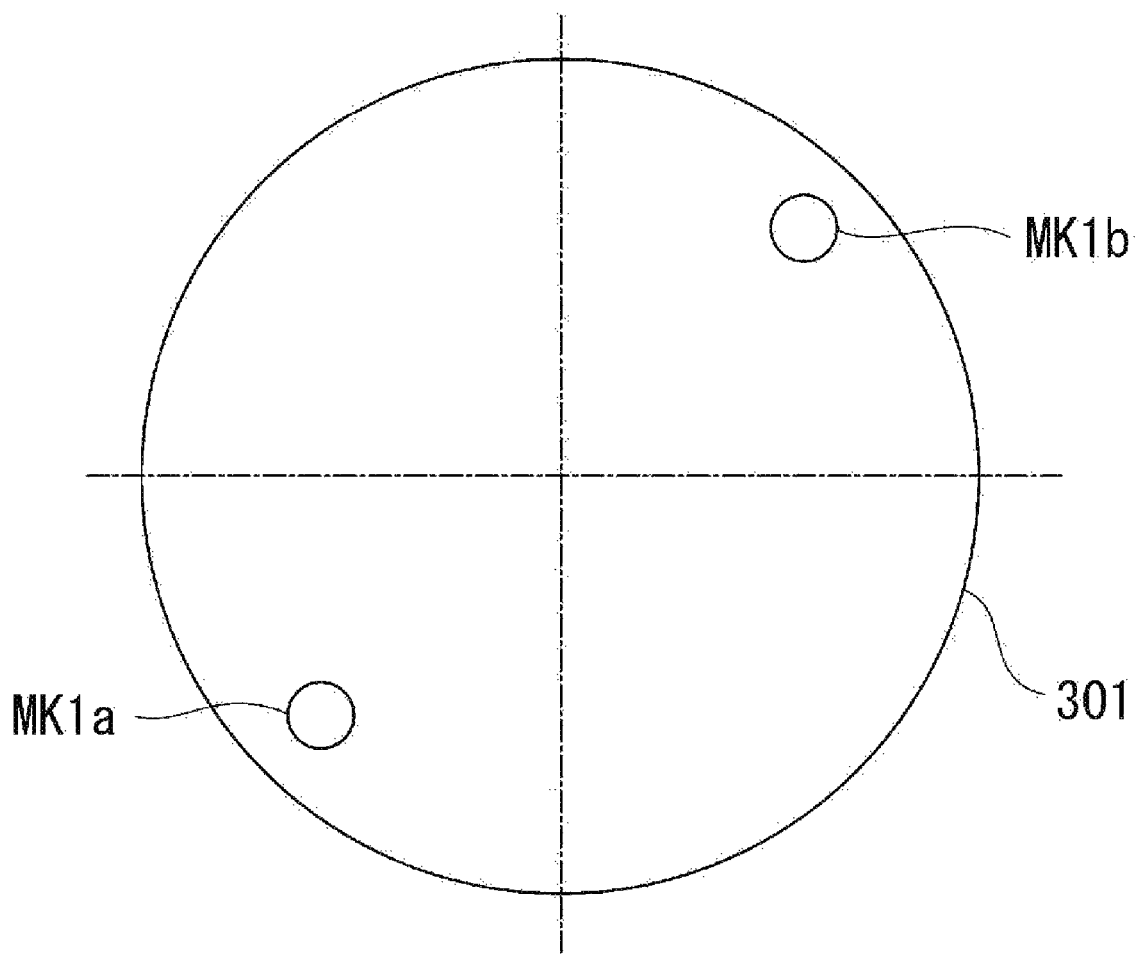
FIG. 9 is a schematic diagram illustrating two alignment markings given to the one substrate.
Figure 10:
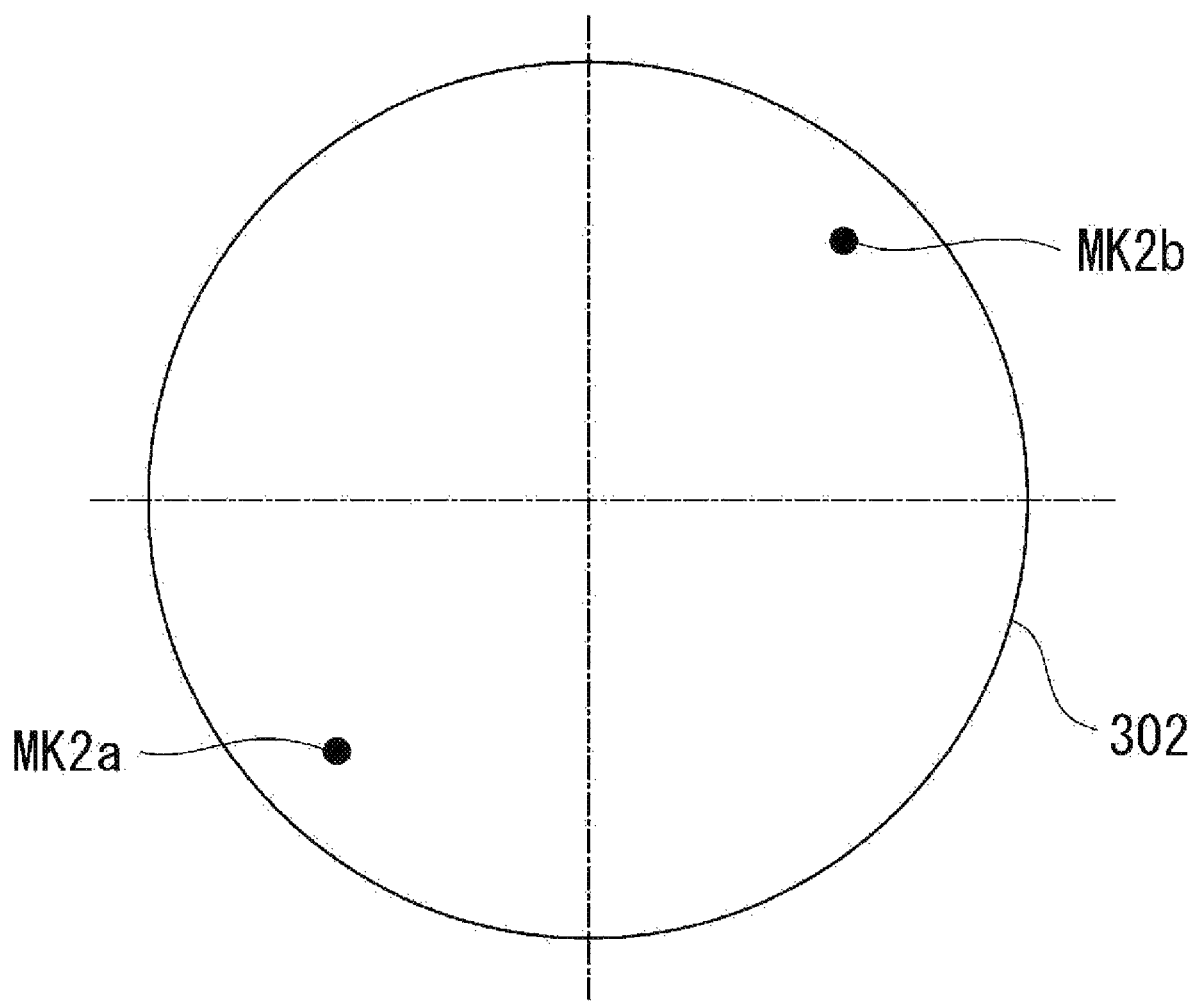
FIG. 10 is a schematic diagram illustrating two alignment markings given to the other substrate.
Figure 11:
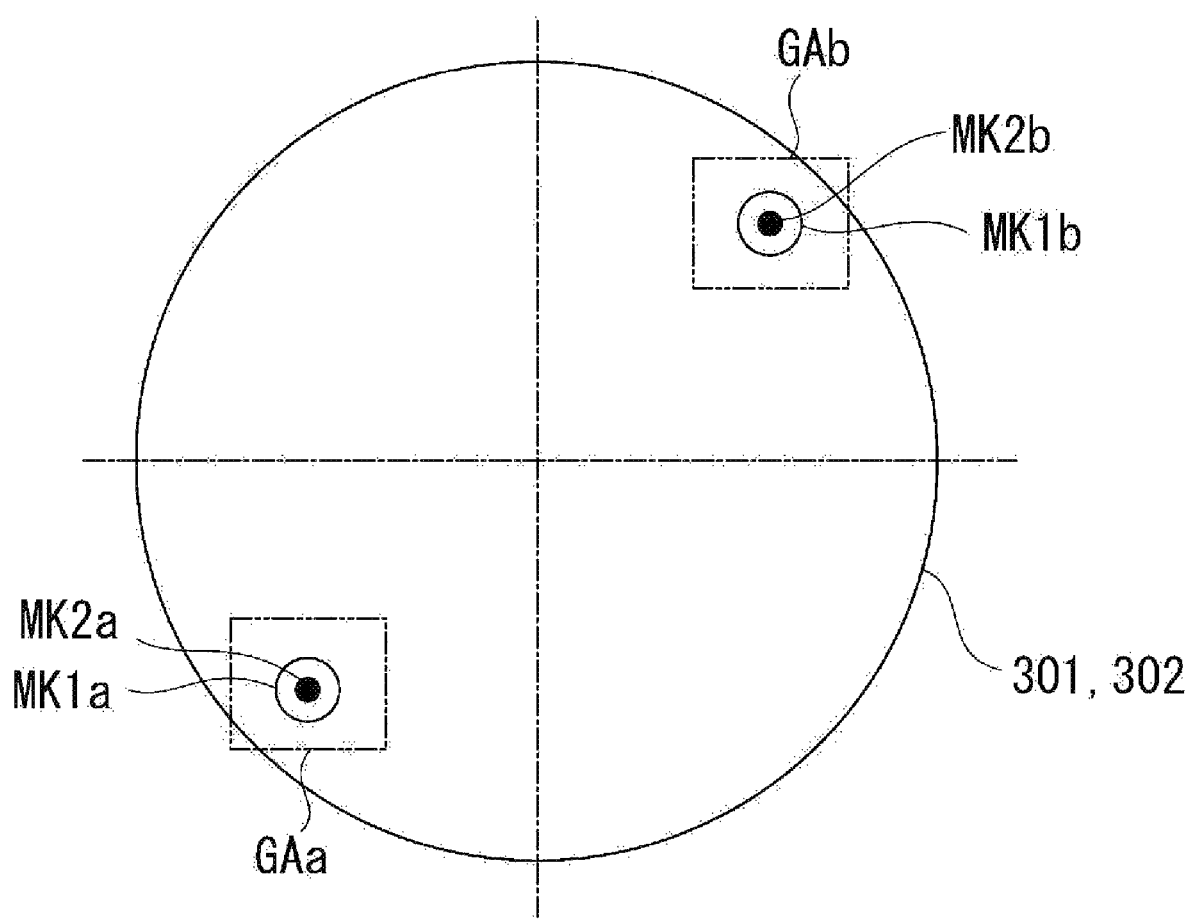
FIG. 11 is a schematic diagram illustrating alignment marking picked-up image relating to both the substrates.
Figure 12:
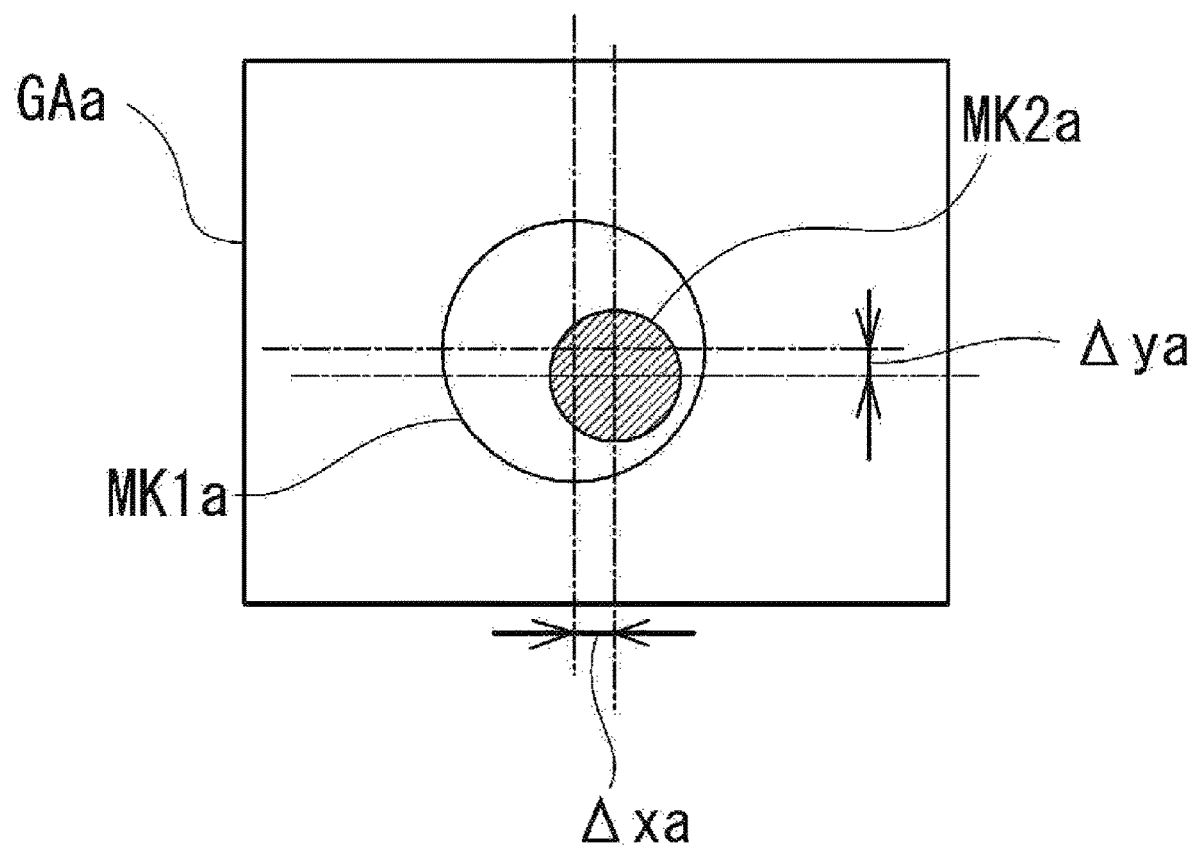
FIG. 12 is a schematic diagram illustrating a condition in which a pair of markings is displaced.

FIG. 9 is a diagram illustrating two alignment markings provided on the one substrate. FIG. 10 is a diagram illustrating two alignment markings provided on the other substrate. FIG. 11 is a diagram illustrating an alignment marking image relating to both the substrates. FIG. 12 is a diagram illustrating a condition in which a pair of markings is displaced relative to each other.

As illustrated in FIG. 9 and FIG. 10, respective alignment markings for aligning are given to both the substrates 301, 302. For example, two alignment markings MK1a, MK1b (FIG. 9) are provided on the one substrate 301, while two alignment markings MK2a, MK2b (FIG. 10) are provided on the other substrate 302.

The position measuring means 500 is also capable of recognizing the positions of both the substrates 301, 302 using a picked-up image (image data) GA relating to transmitted light and reflected light of lights emitted from the respective coaxial lighting systems of the cameras 501, 502 with both the substrates 301, 302 facing with each other. In other words, the positional displacement measurement for an alignment action (fine alignment action) of both the substrates 301, 302 is executed by simultaneously recognizing the positions of the two sets of alignment markings (MK1a, MK2a), (MK1b, MK2b) given to both the substrates 301, 302 by the cameras 501, 502.

The position measuring means 500 obtains an image GAa that contains the markings MK1a, MK2a, and an image GAb that contains the markings MK1b, MK2b (FIG. 11), and recognizes the position of each set of markings (MK1a, MK2a), (MK1b, MK2b) given to both the substrates 301, 302 based on the images GAa, GAb. The controller 700 is capable of obtaining a positional displacement ($\Delta xa$, $\Delta ya$) between the markings (MK1a, MK2a), (MK1b, MK2b) based on the relative positions of the recognized markings (MK1a, MK2a), (MK1b, MK2b) (FIG. 12).

FIG. 11 illustrates a condition in which the respective sets of markings (MK1a, MK2a), (MK1b, MK2b) have the centers laid over on each other and located at the substantially desired positions, and FIG. 12 illustrates a condition in which the set of markings (MK1a, MK2a) is displaced from the desired positions.

As illustrated in FIG. 12, with respect to each image GAa, GAb (FIG. 12 illustrates the image GAa), the positional displacements ($\Delta xa$, $\Delta ya$), ($\Delta xb$, $\Delta yb$) of the respective sets of markings are obtained based on the geometric relationship between the markings of the substrates 301, 302.

<Calculation of Correction Movement Amount and Movement Action>

The controller 700 calculates relative positional displacements $\Delta D$ (more specifically, $\Delta x$, $\Delta y$, $\Delta \theta$) in the X direction, the Y direction, and the $\theta$ direction from the desired positions of both the substrates 301, 302 based on the positional displacements ($\Delta xa$, $\Delta xb$), ($\Delta xb$, $\Delta yb$) of the two sets of markings (MK1a, MK2a), (MK1b, MK2b). The relative positional displacement $\Delta D$ is equivalent to the correction movement amount by the subsequent correction movement.

The controller 700 calculates, in response to the relative displacement $\Delta D$ ($\Delta x$, $\Delta y$, $\Delta \theta$) between the substrates 301, 302, a correction movement route to eventually move the substrates 301, 302 by a correction amount $-\Delta D$ ($-\Delta x$, $-\Delta y$, $-\Delta \theta$). Next, the controller 700 gives instructions to the driving mechanisms 403 to 407 of the respective stages 401, 402 so as to move both the substrates 301, 302 along the calculated correction route.

The correction movement is executed so as to change the relative displacement $\Delta D$ to be zero or to reduce such a relative displacement. In the case of the substrate bonding apparatus 100 illustrated in FIG. 1, the driving mechanisms 403, 404 are controlled so as to eventually move the stage 402 that is supporting the substrate 302 by the correction amount ($-\Delta D$) relative to the stage 401 that is supporting the substrate 301. In response to the instructions from the controller 700, the driving mechanisms 403, 404 drive the stage 402 in the two translation directions (X direction and Y direction) and the rotation direction (θ direction). Hence, both the substrates 301, 302 are moved relative to each other, and thus the above positional displacement ΔD is corrected.

The correction movement may be executed in the case in which the bonding surfaces of the substrates are apart from each other, and in the case in which such bonding surfaces are in contact with each other. The correction movement in each case will be explained later.

The positional displacement ΔD (more specifically, Δx, Δy, Δθ) within a plane (horizontal plane) perpendicular to the vertical direction (Z direction) is measured as explained above, and the alignment action (fine alignment action) to correct the positional displacement ΔD is executed.

In the above case, although the explanation has been given of an example case in which the two images GAa, GAb are picked up and obtained in a paratactic manner (substantially simultaneously) using the two cameras 501, 502, the present disclosure is not limited to this case. For example, the respective images GAa, GAb may be picked up and obtained in sequence by moving the single camera in the X direction and/or in the Y direction. In addition, each set of markings is simultaneously picked up on the same optical axis, but the present disclosure is not limited to this case. When, for example, in the translation directions (X direction and Y direction), the substrates are located at different positions, two sets of cameras (total: four cameras) may be applied relative to the respective positions of the substrates. When the positional relationship of the optical axes of the cameras is known, by picking up the image of each corresponding marking (MK1a, MK2a) by each camera, and by synthesizing the images, the substrates can be moved to the substantial bonding positions in the translation directions and be positioned.

<Hydrophilization Treatment Means>

The substrate bonding apparatus 100 includes the hydrophilization treatment means 600. The hydrophilization treatment means 600 of the substrate bonding apparatus illustrated in FIG. 1 includes an activation treatment unit 610 that activates the bonding surfaces of the substrates 301, 302, and a hydrophilization treatment unit 620 that performs hydrophilization treatment on the activated bonding surfaces of the substrates 301, 302.

Example activation treatment units 610 are a particle beam source and a plasma source.

The activation treatment unit 610 causes particles having a predetermined kinetic energy to collide with the substrate under a vacuum condition to cause a phenomenon (sputtering phenomenon) of physically flicking a substance forming the bonding surface, thereby removing a surface layer. In the surface activation treatment, not only the surface layer is removed to expose the new surface of the substance to be bonded but also the exposed new surface is collided with particles with a predetermined kinetic energy to disrupt the crystal structure therearound, and to obtain an amorphous surface. The amorphous new surface has an increased surface area in atomic level, and has a further high surface energy. Hence, the number of hydroxyl groups (OH) to be coupled in the subsequent hydrophilization treatment per a surface area may increase. In contrast, when chemical hydrophilization treatment is performed after the impurities on the surface are removed by the conventional wet treatment, since there is no physical change in the new surface due to the collision with particles that have the predetermined kinetic energy, the hydrophilization treatment subsequent to the surface activation treatment in the bonding method according to the present disclosure is primary different from the conventional hydrophilization treatment in this point. In addition, when the crystal structure is disrupted, atoms present in the nearby region to the amorphous new surface may easily diffuse at a relatively low thermal energy, enabling an accomplishment of final bonding process at a relatively low temperature.

Example particles applicable to the surface activation treatment are noble gases, such as neon (Ne), argon (Ar), krypton (Kr), and xenon (Xe), or an inactive gas. Since those noble gases have a relatively large mass, the sputtering phenomenon is effectively caused, enabling a disruption of the crystal structure of the new surface.

Other applicable particles to the surface activation treatment are oxygen ions, atoms, and molecules. By performing the surface activation treatment using the oxygen ions, or the like, after the surface layer is removed, the new surface is covered by an oxidized thin film. The oxidized thin film on the new surface may enhance the efficiency of coupling of the hydroxyl (OH) groups or adherence of water in the subsequent hydrophilization treatment. In addition, the oxidized thin film formed on the new surface may be relatively easily decomposed in the heat treatment of the bonding.

The preferable kinetic energy of particles to be collided with the bonding surface subjected to the surface activation is between 1 eV (electron volt) and 2 keV. The above kinetic energy may effectively cause the sputtering phenomenon to the surface layer. The desired kinetic energy value may be set from the above kinetic energy range in accordance with the thickness of the surface layer to be removed, the characteristics of the material, the material of the new surface, and the like.

The predetermined kinetic energy is given to the particles to be collided with the bonding surface subjected to surface activation by accelerating the particles toward the bonding surface.

In addition, the predetermined kinetic energy can be also given to the particles using a plasma generator. By applying an AC voltage to the bonding surface of the substrate, plasma containing the particles is generated around the bonding surface, and the anions of the ionized particles within the plasma are accelerated toward the bonding surface by the above voltage, thereby giving the predetermined kinetic energy. Since the plasma can be generated under an atmosphere at a low vacuum degree like several pascals (Pa), the vacuum system can be simplified, and the processes like vacuuming can be also simplified.

Since the particle beam source is actuated under a relatively high vacuum condition like equal to or lower than $1\times10^{-2}$ Pa (pascal) or $1\times10^{-5}$ Pa, unnecessary oxidization of the new surface and sticking of impurities thereto after the surface activation treatment are preventable. In addition, since the particle beam source is capable of applying a relatively high acceleration voltage, a high kinetic energy can be given to the particles. Hence, the removal of the surface layer and the obtainment of the amorphous new surface may be effectively accomplished.

A plasma generator is actuated at, for example, 100 W, and generates plasma of nitrogen ($N_2$), oxygen ($O_2$), or argon (Ar) for hydrophilization treatment, and emits such plasma to the bonding surface for substantially 30 seconds. Hence, the treatment for hydrophilization can be applied.

In addition, the plasma generator and the bonding apparatus may be installed separately, coupled under the vacuum condition, or once released from each other for handling under an ambient atmosphere.

The applied particles to the surface activation may be also neutral atoms or ions. In this case, using the particle beam source, such as a neutral atom beam source or an ion beam source (ion gun) disposed at the location apart from the bonding surface, the predetermined kinetic energy can be given to the particles. The particles to which the predetermined kinetic energy is given are emitted from the particle beam source to the bonding surface of the substrate.

In addition, as for the reaction gas, nitrogen ($N_2$), oxygen ($O_2$), argon (Ar), and the like, are applicable.

An example neutral atom beam source applicable is a fast atom beam (FAB) source. Typically, the fast atom beam (FAB) source generates a plasma gas, applies an electrical field to this gas to extract anions of the particles dissociated from the plasma, and causes the anions to pass through an electron cloud, thereby neutralizing the atoms. In this case, for example when argon (Ar) is used among the noble gases, the supplied power to the fast atom beam (FAB) source may be set to 1.5 kV (kilovolt), and 15 mA (milliampere), or may be set to be a value between 0.1 W (watt) and 500 W (watt). When, for example, the fast atom beam (FAB) source is actuated at, between 100 W (watt) and 200 W (watt), and the argon (Ar) fast atom beam is emitted for about two minutes, the above oxidized materials, contaminants, and the like (surface layer), on the bonding surface are removed, and the new surface can be exposed.

The ion beam source (IG) may be actuated at, for example, 110 V and 3 A, and utilized to accelerate argon (Ar) and to emit the accelerated argon beam to the bonding surface for about 600 seconds.

According to the present disclosure, the applied particles to the surface activation may be neutral atoms or ions, or radical species, and further a particle group of the combination of those.

The surface layer removing speed may vary depending on the actuation condition of each plasma or beam source, or the kinetic energy of the particles. Hence, adjustment of the necessary process time for the surface activation treatment is necessary. For example, by applying a surface analysis scheme, such as an Auger Electron Spectroscopy (AES) or an X-ray Photo Electron Spectroscopy (XPS), a time at which the presence of oxygen and carbon contained in the surface layer becomes undetectable, or a longer time than that time may be adopted as the process time for the surface activation treatment.

In order to obtain the amorphous bonding surface in the surface activation treatment, the particle emission time may be set to be longer than the necessary time to remove the surface layer and to expose the new surface. The extended time may be set to be 10 seconds to 15 minutes, or be equal to or greater than 5% of the necessary time to remove the surface layer and to expose the new surface. The time to obtain the amorphous bonding surface in the surface activation treatment may be set as appropriate in accordance with the kind of the material forming the bonding surface, the characteristics thereof, and the emission condition of the particles that have the predetermined kinetic energy.

In order to obtain the amorphous bonding surface in the surface activation treatment, the kinetic energy of the emitted particles may be set to be higher than the necessary kinetic energy to remove the surface layer and to expose the new surface by 10% or more. The kinetic energy of the particles to obtain the amorphous bonding surface in the surface activation treatment may be set as appropriate in accordance with the kind of the material forming the bonding surface, the characteristics thereof, and the emission condition of the particles.

In this case, the term "amorphous surface" or "surface having a disrupted crystal structure" covers an amorphous layer where the presence is detected by a measurement through a specific surface analysis scheme, or a layer where the crystal structure is disrupted, and is a conceptual term that expresses the condition of the crystal surface when the particle emission time is set to be relatively long, or when the kinetic energy of the particles is set to be relatively high, and also covers a surface where the presence of the amorphous layer by measurement through a specific surface analysis scheme or of the surface having the crystal structure disrupted is undetectable. In addition, the term "obtainment of amorphous" or "disruption of crystal structure" is a conceptual expression for an action to form the amorphous surface or the surface where the crystal structure is disrupted.

In addition, according to the method that utilizes the FAB or the IG, by presenting a material that contains Si within a casing, an Si particle beam can be emitted simultaneously with the Ar particle beam.

According to this method, Si is doped in the boundary, the boundary that contains a further large number of active Si is formed, a further large number of OH groups is formed at the time of hydrophilization treatment, and thus the strength is enhanced. In particular, this is effective to enhance the bonding strength under the vacuum condition.

In the case in which, for example, an Si plate is disposed on the bottom of the FAB casing and the emission is performed at 1 kV, 100 mA, and 100 ccm of Ar, as for the bonding strength of the Si wafer with an oxidized film, when there was no Si plate, the strength was 1.5 $J/m^2$, but the strength was enhanced to the strength that causes a bulk breakdown at 2.5 $J/m^2$ or more.

In addition, as for the particle beam treatment by the FAB or the IG, such apparatus may be disposed within the bonding apparatus, or may be carried and coupled as another apparatus under the ambient atmosphere.

<Hydrophilization Treatment Unit>

The hydrophilization treatment unit 620 couples the hydroxyl groups (OH groups) to the bonding surface of the substrate 301, 302 having undergone cleansing or activation by the above activation treatment unit 610.

The hydrophilization treatment by the hydrophilization treatment unit 620 is performed by supplying water ($H_2O$) around the bonding surfaces of the substrates 301, 302 having undergone the surface activation within the chamber 200. Hence, the hydrophilization treatment unit 620 includes a water gas generator 621, a valve 622, and a water gas supplying pipe 623.

The water is supplied by, for example, introducing gaseous water ($H_2O$) to the atmosphere around the bonding surfaces having undergone the surface activation. The gaseous water is produced by argon (Ar) carrier gas to pass through in a bubble form (bubbling) at the water gas generator 621. The gaseous water is mixed with the carrier gas, is controlled to the desired flow rate by the valve 622, passes through the water gas supplying pipe 623, and is introduced in the chamber 200. The carrier gas in this case is not limited to argon (Ar), and may be, for example, nitrogen ($N_2$), helium (He), or oxygen ($O_2$).

In addition, the water may be in other forms, such as water vapor, or may be introduced in the chamber 200 by spraying the liquid water as mists. Still further, as for the other aspects of the adherence of water to the bonding surfaces of the substrates 301, 302, radicals or ionized OH groups, and the like, may be stuck.

In order to cause the water to adhere to the bonding surface of the substrate, the substrate may be cooled, and the bonding apparatus according to this embodiment may include a cooling device for this purpose. Even if the environmental humidity is around 50%, by cooling the substrate, the humidity of the substrate surface can be increased to substantially 85 to 100%.

In the hydrophilization treatment, water, hydroxide, hydroxide ions (OH−), or hydroxyl radical (.OH), or ions and radicals of OH containing substance expressed as OH (hereinafter, those will be referred to as "water, and the like") are stuck on the bonding surface having undergone the surface activation treatment, and thus a layer that is terminated (M-OH) by hydroxyl group is formed on the bonding surface.

According to the present disclosure, a substance to be stuck on the bonding surface having undergone the surface activation treatment in the hydrophilization treatment step will be referred to as "water or OH containing substance", and collectively, "water, and the like", or more simply, "water", and those notations collectively represent the above substances, and are not limited to "water ($H_2O$)" only.

By controlling the ambient humidity around the bonding surfaces of the substrates 301, 302 having undergone the surface activation, the hydrophilization treatment step is also controllable. This humidity may be calculated as a relative humidity or may be calculated as an absolute humidity, or other definitions may be applied.

The water introduction is preferably controlled in such a way that the relative humidity of the atmosphere around either one or both of the bonding surfaces of both the substrates becomes between 10% and 90%.

When, for example, gaseous water is introduced with the carrier gas that is nitrogen ($N_2$) or oxygen ($O_2$), the entire internal pressure of the above chamber is set to be $9.0 \times 10^4$ Pa (pascal), that is, 0.89 atm (atom), and the gaseous water amount in the chamber is controlled to 8.6 $g/m^3$ (gram/cubic meter) or 18.5 $g/m^3$ (gram/cubic meter) in the volume absolute humidity, and to 43% or 91%, respectively, in the relative humidity at the temperature of 23° C. (Celsius 23 degrees). In addition, when copper (Cu) is exposed to an atmosphere that contains the gaseous water of between 5 $g/m^3$ (gram/cubic meter) and 20 $g/m^3$ (gram/cubic meter) in the volume absolute humidity, a formation of an oxidized copper layer of 2 nm (nano-meter) to 14 nm (nano-meter) is expected.

Still further, the concentration of oxygen ($O_2$) in the atmosphere within the chamber may be set to 10%.

In order to perform the hydrophilization treatment, an external ambient air that has a predetermined humidity may be introduced in the chamber. When the ambient air is introduced in the chamber, in order to prevent undesirable impurities from sticking on the bonding surface, a structure in which the ambient air passes through a filter is preferable. By performing the hydrophilization treatment with an ambient air being introduced from the exterior of the chamber and having a predetermined humidity, the device structure for the hydrophilization treatment on the bonding surface can be simplified.

In addition, molecules, clusters, and the like, of water ($H_2O$) may be accelerated, and emitted to the bonding surface. The particle beam source applied to the above surface activation treatment may be also applied to accelerate water ($H_2O$). In this case, a mixture gas containing the carrier gas is produced through the above bubbling, or the like, and water ($H_2O$) is introduced in the above particle beam source to produce water particle beam, and this beam is emitted to the bonding surface subjected to the hydrophilization treatment. Still further, plasma of water molecules may be accomplished under the atmosphere around the bonding surface, and may be caused to contact the bonding surface.

After the surface activation treatment based on the particle beam emission or the plasma exposure, as hydrophilization treatment, a water cleansing to remove particles (contaminants) may be performed. According to this water cleansing, the same effect as that of the above hydrophilization treatment is accomplished.

As for the hydrophilization treatment, the same type or different type of hydrophilization treatments may be executed by multiple times. In addition, as a part of the hydrophilization treatment, or after the hydrophilization treatment, water molecules may be forcibly stuck on the bonding surface. Accordingly, the amount of water molecules on the bonding surface can be increased or controlled. Still further, this enables an adjustment of a critical pressure.

The bonding surfaces having undergone the surface activation treatment and the hydrophilization treatment are to be bonded together with the water molecules being present therebetween as explained above, but by drawing out the water molecules, the bonding surfaces are attracted with each other by the action of hydrogen coupling of OH groups, and thus a tentative bonding that is relatively intensive is formed. In addition, since the bonding boundary that contains hydrogen and oxygen is formed, by the heat treatment according to the present disclosure, hydrogen and oxygen are repelled to the exterior of the bonding boundary, and thus a clean bonding boundary can be formed.

According to this embodiment, the pressing method and the heating method are explained as the bonding scheme, but by performing pressurization beyond the critical pressure, for example, by performing pressurization at 10 MPa, the water molecules are pushed out, changing to a coupling of OH groups.

In addition, the water molecules are removed from the boundary by applying heat, changing to a coupling of OH groups. By continuously and subsequently performing the heating, the coupling changes from the hydrogen coupling to a covalent coupling, which transitions the substrates to a solid final bonded condition.

Still further, by leaving the substrates under a vacuum condition for a long time to repel the water molecules, and then performing bonding, the similar tentative bonded condition is maintainable. The substrates may be bonded together by pressing in a bonded condition in which water molecules are present, or may be bonded under a vacuum condition. In order to transition the tentative bonding to the solid bonding, heating may be also applied. Moreover, the bonding can be transitioned to the solid bonding by performing heating from the initial stage.

In view of the alignment precision, however, heating results in a thermal expansion of the substrate, and thus heating with the bonding surfaces being pressed beforehand and bonded under a vacuum condition so as to obtain a tentative bonding condition is effective.

The hydrophilization treatment may form an oxidized material on the bonding surface. However, by adherence of water and the like sequentially after the surface activation treatment, a hydroxyl (OH) group can be immediately formed on the new surface to which no impurities stick, and by adherence of water and the like to such a new surface, the water molecules adheres to the hydroxyl (OH) group. This oxidized material is relatively controlled (for example, the thickness is several nm or equal to or less than several atom layers), thus not particularly decreasing the electrical characteristics. This may be absorbed within a metal material by heat treatment after the bonding, or may be repelled as water from the bonding boundary to the external side, thus being dissipated or reduced. Hence, in this case, there is no practical problem for the conductivity via the bonding boundary between the substrates.

At the time of correction movement, there are cases in which the substrates can be moved while maintaining the contacting condition, and in which the substrates are moved with a gap being formed therebetween. When the water molecules are present and the contact area is small, the substrates can be moved in the contacting condition. The gap to be formed in this case may be several μm.

<Bonding Method>

Next, an explanation will be given of the bonding method of the substrates 301, 302 by the above substrate bonding apparatus 100.

Figure 13:
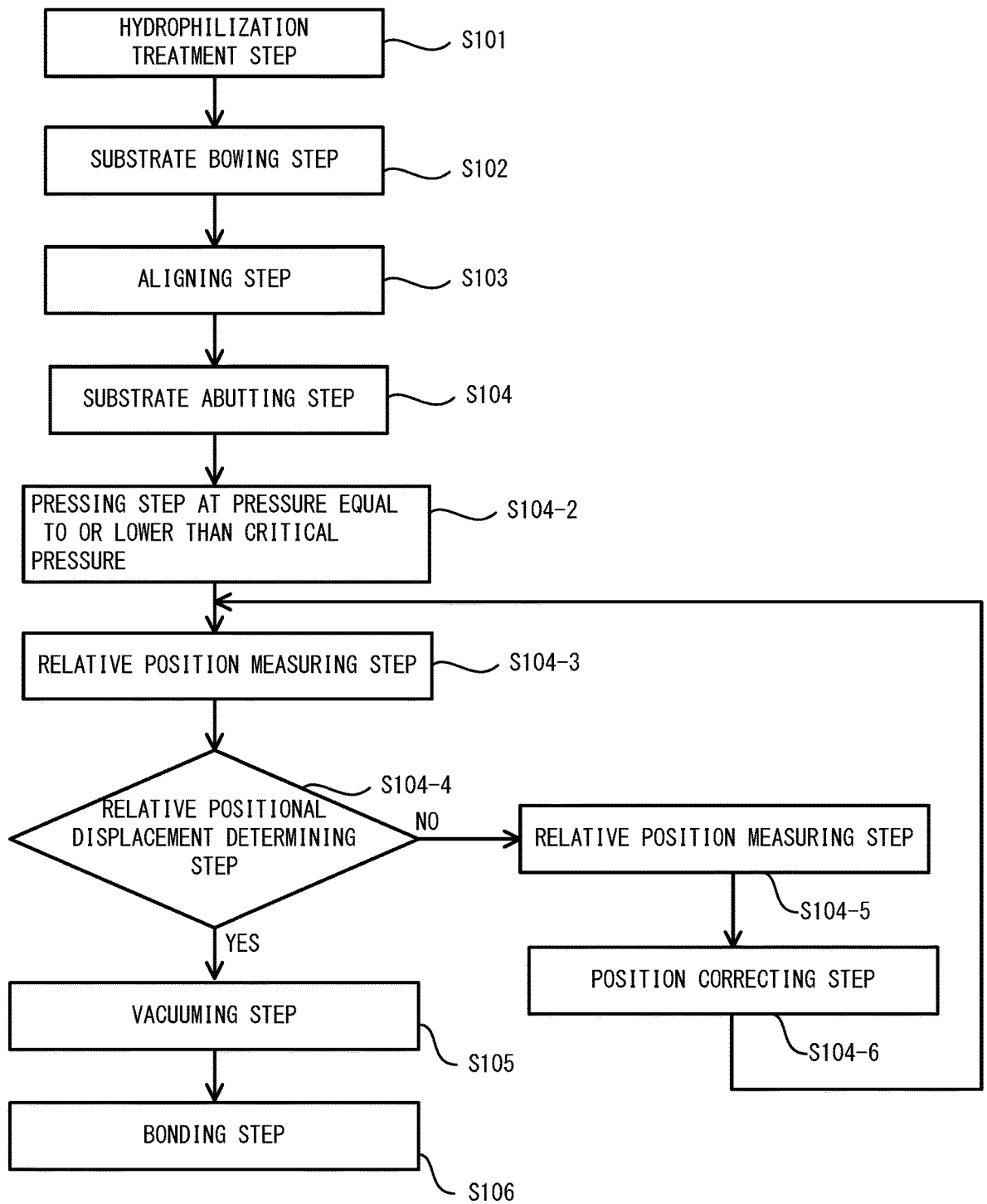
FIG. 13 is a flowchart illustrating a substrate bonding method according to the present disclosure.

FIG. 13 is a flowchart illustrating a substrate bonding method according to the present disclosure.

As illustrated in this FIG. 13, in order to bond the substrates 301, 302, a hydrophilization treatment step S101, a bowing step S102 of the substrate 301, an aligning step S103 for the substrates 301, 302, an abutting step S104 of the substrates 301, 302, a vacuuming step S105, and a bonding step S106 of the substrates 301, 302 are executed in sequence.

Hereinafter, each of the above steps will be explained in detail.

<Hydrophilization Treatment Step S101>

In the hydrophilization treatment step S101, the hydrophilization treatment is performed on the surfaces that are the bonding surfaces of the respective substrates 301, 302.

In this case, first, as illustrated in FIG. 3, the substrate 301 is held by the holder mechanism (unillustrated) on the stage 401 of the substrate bonding apparatus 100, and the outer circumferential portion 302s of the substrate 302 is held by the holder mechanism (unillustrated) on the stage 402. In this condition, the substrate 301 and the substrate 302 face with each other with the respective bonding surfaces being apart from each other.

In this case, the chamber 200 is released to an ambient pressure, and an ambient air is introduced to the surrounding atmosphere of the substrates 301, 302 in the chamber 200.

Next, the activation treatment unit 610 of the hydrophilization treatment means 600 activates the bonding surfaces of the substrates 301, 302 by any one of the above activation treatment schemes. For example, sputtering to cause argon (Ar) plasma to collide with the bonding surfaces of the substrates 301, 302 may be applied. In this case, the surface layers of the respective bonding surfaces of the substrates 301, 302 are removed, and the respective new surfaces containing the substance to be bonded are exposed, and the crystal structure around the exposed new surface is disrupted. Hence, an amorphous new surface is obtained.

Subsequently, the hydrophilization treatment unit 620 performs the hydrophilization treatment on the respective activated bonding surfaces of the substrates 301, 302 by any one of the above hydrophilization treatments. For example, gaseous water is produced by the water gas generator 621, and the produced gaseous water is introduced in the chamber 200 via the water gas supplying pipe 623 with the carrier gas. When the hydrophilization treatment is performed with an OH containing substance like water being stuck on the respective bonding surfaces of the substrates 301, 302 having undergone the surface activation treatment, a layer terminated (M-OH) by the hydroxyl group (OH group) is formed on the bonding surface.

<Bowing Step S102 of Substrate 301>

In the bowing step S102 of the substrate 301, as illustrated in FIG. 4, with the respective bonding surfaces of the substrates 301, 302 facing with each other, the substrate 301 is bowed in such a way that the central portion 301c protrudes toward the substrate 302 relative to the outer circumferential portion 301s of the bonding surface.

In order to accomplish such a bowing, at the lower stage 401, the protruding mechanism 430 embedded in the central portion of the supporting surface that supports the substrate 301 is actuated to protrude toward the upper stage 402.

<Aligning Step S103 of Substrates 301, 302>

The substrates 301, 302 are aligned with each other in the aligning step S103.

In order to accomplish such an alignment, in the position measuring means 500, with the bowed substrate 301 facing the substrate 302, using picked-up images (image data) GA relating to the transmitted light and the reflected light of the light emitted from the respective coaxial lighting systems of the cameras 501, 502, the positions of both the substrates 301, 302 are recognized. The position measuring means 500 obtains the image GAa that contains the markings MK1a, MK2a, and the image GAb that contains the markings MK1b, MK2b (FIG. 11), and the positions of each set of markings (MK1a, MK2a), (MK1b, MK2b) given to both the substrates 301, 302 are recognized based on those images GAa, GAb. The controller 700 obtains the positional displacements (Δxa, Δya), (Δxb, Δyb) between the markings (MK1a, MK2a) and (MK1b, MK2b) based on the relative positions of the recognized markings (MK1a, MK2a) and (MK1b, MK2b) (FIG. 12).

The controller 700 calculates, based on the positional displacements (Δxa, Δya), (Δxb, Δyb) of the two sets of markings (MK1a, MK2a) and (MK1b, MK2b), the relative displacement ΔD (more specifically, Δx, Δy, Δθ) in the X direction, the Y direction, and the θ direction from the desired positions of both the substrates 301, 302.

Next, the controller 700 calculates the correction movement route so as to eventually move the substrates 301, 302 by the correction amount −ΔD (−Δx, −Δy, −Δθ) in accordance with the relative displacement ΔD (Δx, Δy, Δθ) between the substrates 301 and 302. Subsequently, the controller 700 gives instructions to the driving mechanisms 403 to 407 for the respective stages 401, 402 so as to move both the substrates 301, 302 along the calculated correction route.

In response to the instructions from the controller 700, the driving mechanisms 403, 404 drive the stage 402 in the two translation directions (X direction and Y direction), and the rotation direction (θ direction). Hence, both the substrates 301, 302 are moved relative to each other, and the above positional displacement ΔD is corrected.

<Abutting Step S104 of Substrates 301, 302>

Figure 14:
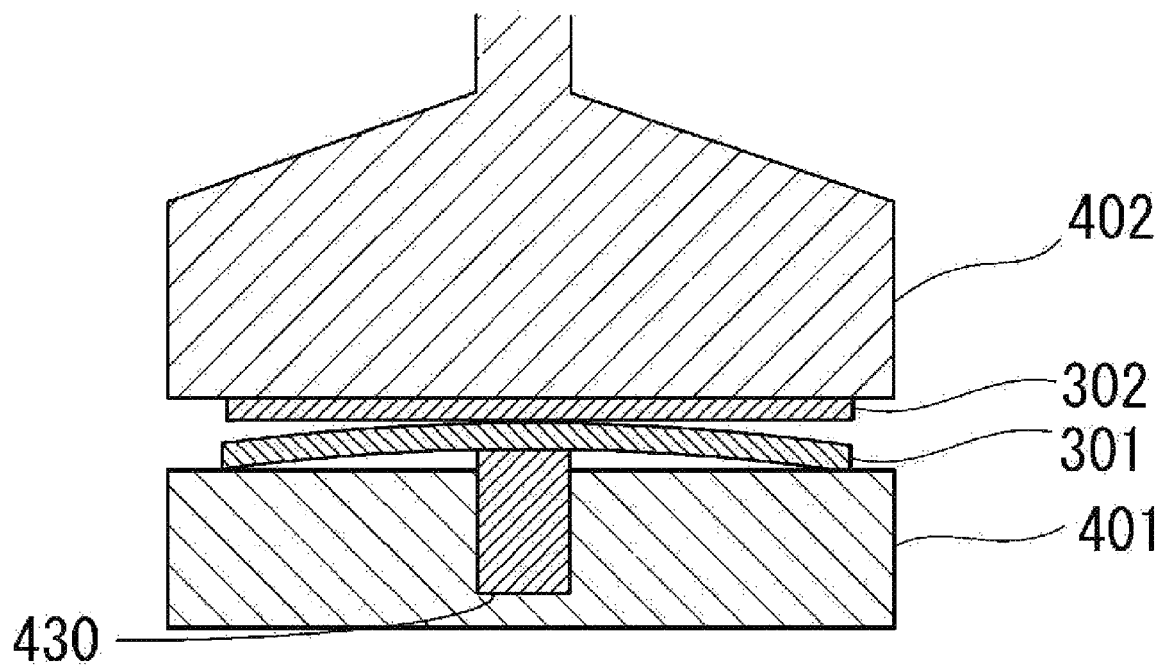
FIG. 14 is a schematic front cross-sectional view illustrating a condition in which a central portion of the bowed substrate abuts the upper substrate.

FIG. 14 is a front cross-sectional view illustrating a condition in which the central portion of the bowed substrate abuts the upper substrate.

In the abutting step S104, as illustrated in FIG. 14, the bonding surface of the substrate 301 and that of the substrate 302 are abutted with each other at the respective central portions.

In order to accomplish such an abutment, by the Z-direction moving up-and-down driving mechanism 406 of the stage driving mechanism 404, the stage 402 is moved toward the lower stage 401 along the Z direction. Next, with the central portion 301c being bowed so as to be convex upwardly, the substrate 301 held by the stage 401 is abutted with the substrate 302 held by the upper stage 402. Hence, the bonding surface of the substrate 301 and that of the substrate 302 are abutted at the respective central portions.

In this condition, since ambient air is introduced in the chamber 200, a layer terminated (M-OH) by the hydroxyl group (OH group) is present between the bonding surface of the substrate 301 and that of the substrate 302, and on the bonding surface having undergone the hydrophilization treatment.

<Pressing Step S104-2 at Pressure Equal to or Lower than Critical Pressure>

Next, with the bonding surface of the substrate 301 and that of the substrate 302 being abutted with each other at the respective central portions in the abutting step S104, the Z-direction moving up-and-down driving mechanism 406 is driven to move down the stage 402, and a pressure that is equal to or lower than the critical pressure is applied to the bonding surface of at least either substrate 301, 302. The pressure application may start simultaneously with a contact, or may start after a certain time has elapsed from the contact. In addition, the pressure application may be performed across a certain time segment in the contacting condition, or may be performed across the whole time segment. Still further, the pressure application may be performed intermittently, and while the pressure is being applied, a constant pressure may be maintained or the pressure may be changed time by time.

The term "critical pressure of bonding surface" is defined as a pressure that changes or loses the desired characteristics of the bonding surface when the bonding surface is pressed at the pressure beyond the foregoing pressure.

When, for example, excessive pressure is applied to the bonding surface in the contacting step (tentative bonding) prior to a step of eventually forming the bonding boundary (final bonding), both the substrates 301, 302 are bonded together and not separable from each other anymore, or even if both the substrates can be separated from each other, when both the substrates are in contact with each other and pressurized, a desired bonding may be not accomplishable. Hence, when the applied pressure to the bonding surface in the contacting step is reduced, the contacting substrates 301, 302 are separable from each other with the substrates 301, 302 being not bonded and without deteriorating the surface characteristics of the desired bonding. Hence, the lowest pressure that still enables a separation of the substrates 301, 302 may be defined as the critical pressure.

Alternatively, when the contact and separation are repeated by multiple times, even if the substrates are still separable, desired characteristics like the bonding strength is not obtainable by the subsequent bonding step by the contact or the repeat of contact. When, for example, the new surfaces are in contact with each other at a part of the contact boundary, and a local or microscopic solid bonding boundary is formed, the substrates 301, 302 may be separable by relatively small force. When, however, the substrates 301, 302 themselves are separable, the formed solid bonding boundary may break due to the separation, deteriorating the surface characteristics. Consequently, the desired bonding characteristics cannot be obtained eventually. In this case, by decreasing the pressure applied to the bonding surface in the contacting step, the exposure of the new surface and the contact thereof can be sufficiently avoided.

As explained above, when the reason is substantially because of too high pressure applied to the bonding surface in the contacting step, by decreasing such a pressure, even if the contact and the separation are repeated by multiple times, the desired bonding strength is still obtainable eventually. Hence, a pressure in the contacting step which enables a separation, and which accomplishes the desired bonding strength eventually may be defined as the critical pressure.

The critical pressure may be defined as a pressure that disables a desired bonding when a pressure equal to or greater than the critical pressure is applied, or may be defined as a pressure that disables the desired bonding when a pressure beyond the critical pressure is applied.

The critical pressure can be determined in accordance with various factors, such as the material forming the bonding surface, the presence or absence of the surface layer on the bonding surface, the characteristics of the surface layer, and the surface energy. Hence, the bonding method according to the present disclosure may include, prior to the step S104-2, a step (unillustrated) of determining the critical pressure for the bonding surface of at least one substrate 301, 302.

The applied pressure in the step S104-2 is desirably equal to or smaller than or less than the smaller critical pressure between the defined critical pressures for the respective bonding surfaces of the substrates 301, 302. Hence, an appropriate pressure application is ensured to either bonding surface of the substrate 301, 302. When no critical pressure is defined for the one bonding surface, a pressure equal to or smaller than or less than the critical pressure of the other bonding surface having the defined critical pressure may be applied.

<Relative Position Measuring Step S104-3>

In a step S104-3, after the above step S104-2, the relative positional relationship of the bonding surfaces of the substrates 301, 302 having the respective central portions contacting with each other or the relative positions of both the bonding surfaces are measured. In order to accomplish this measurement, using the picked-up images GA relating to the transmitted light and the reflected light of light emitted from the respective coaxial lighting systems of the cameras 501, 502 in the position measuring means 500, the positions of the respective sets of markings (MK1$a$, MK2$a$), (MK1$b$, MK2$b$) given to the substrates 301, 302 are recognized. The controller 700 obtains, based on the relative positions of the recognized markings (MK1$a$, MK2$a$), (MK1$b$, MK2$b$), the positional displacements ($\Delta$xa, $\Delta$ya), ($\Delta$xb, $\Delta$yb) between the markings (MK1$a$, MK2$a$), (MK1$b$, MK2$b$).

As explained above, when the measurement of the bonding surfaces of the substrates 301, 302 is executed in a condition in which the contact pressure is applied, and in a condition in which the contact is accomplished and the pressure is applied, the relative positions of the bonding surfaces become close to the final bonded condition. Hence, a further precise and uniform contacting condition can be formed or maintained by pressurization.

<Relative Positional Displacement Determining Step S104-4>

Subsequently, in a step S104-4, when a determination is made that the positional displacement is out of the allowable error range, the process progresses to step S104-5.

Whether or not the positional displacement is within the predetermined allowable error range may be determined based on whether or not a condition in which all three positional displacements ($\Delta$x, $\Delta$y, $\Delta\theta$) are within the respective allowable error ranges is satisfied.

<Correction Movement Amount Calculating Step S104-5>

In the step S104-5, the correction movement amount for the substrate 301, 302 is determined. The correction movement amount for the substrate 301, 302 from the relative position measured in the step S104-3 to the desired relative position is obtained.

In order to obtain such a correction movement amount, the controller 700 calculates, based on the positional displacements (Δxa, Δya) (Δxb, Δyb) of the two sets of markings (MK1*a*, MK2*a*), (MK1*b*, MK2*b*), the relative displacements ΔD (more specifically, Δx, Δy, Δθ) in the X direction, the Y direction, and the 0 direction from the desired positions of both the substrates 301, 302 are calculated.

Next, the controller 700 calculates, in accordance with the relative displacements ΔD (Δx, Δy, Δθ) between the substrates 301, 302, the correction movement route to eventually move the substrates 301, 302 by the correction amounts −ΔD (−Δx, −Δy, Δθ).

For example, the movement route may be formed in such a way that, from the relative position measured in the step S104-3, once the contacting condition of the bonding surfaces is canceled, that is, the bonding surfaces are separated, the substrates 301, 302 are relatively moved in parallel with the opposing bonding surfaces, and the bonding surfaces are contacted with each other again. That is, in the following step S104-3, the contacting bonding surfaces or the contacting substrates 301, 302 are once separated, and are contacted again after the movement by the correction amount.

In addition, the movement route may be formed in such a way that, from the relative position measured in the step S104-3, the pressing of the bonding surfaces in a contacting condition is once canceled or decreased, the substrates 301, 302 are moved in parallel with the opposing bonding surfaces with the respective central portions of the substrates 301, 302 being in contact with each other, and the substrates are pressed again.

The above movement routes are merely examples, and the present disclosure is not limited to those examples.

The correction movement amount may be determined as a function of a predetermined parameter. The preferable parameter to be taken into consideration in such a function is the measured relative positions of the substrates 301, 302. The above function parameter may include other parameters than the measured relative positions of the substrates 301, 302. As explained above, the movement route of the substrate 301, 302 for the relative position correction can be in various forms, and thus the behavior, the error, and the like, of the moving mechanism for the substrate 301, 302 or of the measuring mechanism may be taken into consideration as parameters.

<Position Correcting Step S104-6>

In a step S104-6, the substrates 301, 302 are moved by the correction movement amount determined in the step S104-5. Alternatively, the substrates 301, 302 are moved in accordance with the above obtained movement route. Hence, the measured positional displacement is corrected or minimized.

In order to accomplish such a correction, the controller 700 gives instructions to the driving mechanisms 403 to 407 for the respective stages 401, 402 so as to move both the substrates 301, 302 in accordance with the correction route calculated in the step S104-5.

The driving mechanisms 403, 404 drive the stage 402 in the two translation directions (X direction and Y direction) and the rotation direction (θ direction) in response to the instructions from the controller 700 to relatively move both the substrates 301, 302. Hence, the above positional displacement ΔD is corrected.

When the movement of the substrate 301, 302 covers the movement route for the substrates 301, 302 in a separated condition, the bonding surfaces are abutted with each other at the respective central portions, and are contacted with each other again. In addition, when the substrates 301, 302 are moved while maintaining the substrates 301, 302 or the bonding surfaces thereof in a contacting condition without a separation, at a time point at which the movement completes, the contacting condition in which the substrates 301, 302 abut with each other via the respective central portions is accomplished.

After the position in the position correcting step S104-6 completes, the process returns to the step S104-3 again. Next, the correction movement amount calculating step S104-5 and the position correcting step S104-6 are repeated until the measured positional displacements of the substrates 301, 302 fall in the allowable error range. Hence, a precise alignment can be performed between the substrates 301, 302, and eventually, the bonding boundary that has a high alignment precision between the bonding surfaces or the substrates 301, 302 can be formed.

<Vacuuming Step S105>

In a vacuuming step S105, the atmosphere around the substrate 302 and the substrate 301 having undergone the alignment so as to have the positional displacement within the allowable error range is vacuumed.

In order to accomplish this vacuuming, the discharging pipe 202 is opened, and the vacuum pump 201 is actuated to discharge the gas in the chamber 200 to the exterior via the discharging pipe 202. Hence, the interior of the chamber 200 is depressurized and vacuumed, and thus the atmosphere in the chamber 200 becomes a vacuum or low pressure condition. When the vacuum degree in the chamber 200 reaches the desired value, this condition is maintained.

<Bonding Step S106 of Substrates 301, 302>

Figure 15:
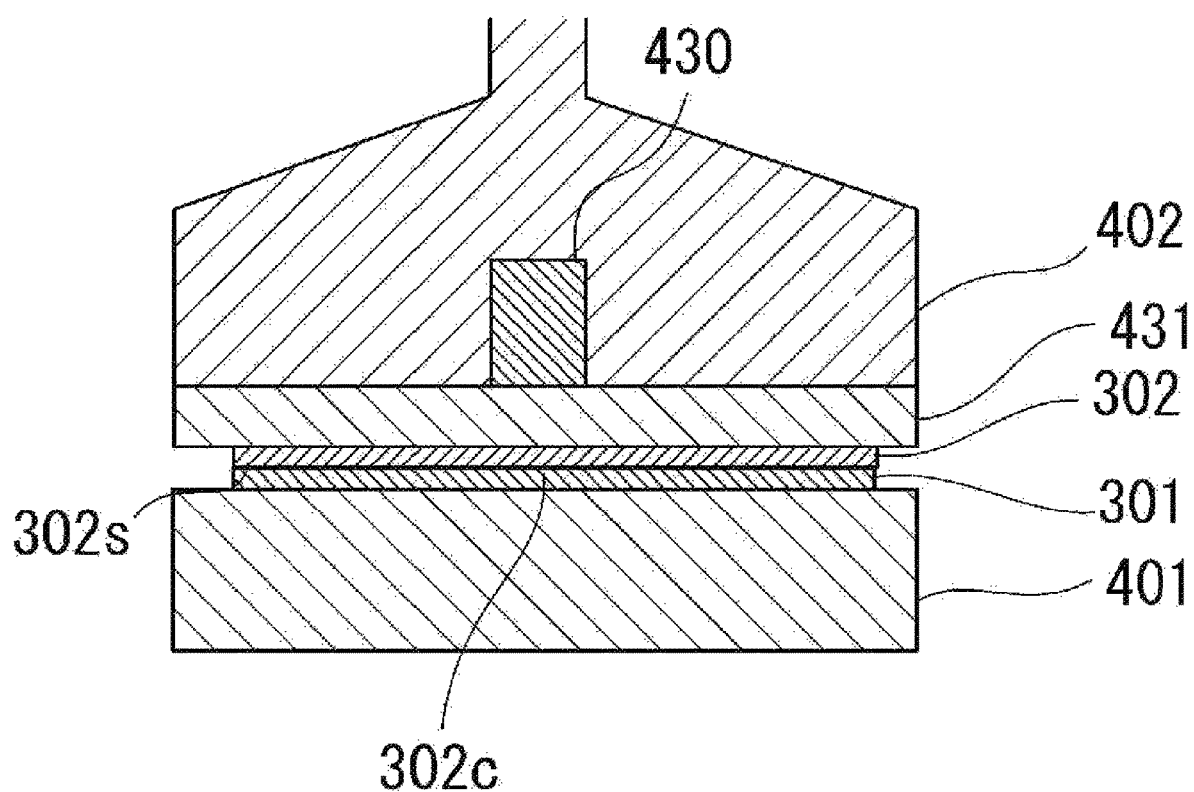
FIG. 15 is a schematic front cross-sectional view illustrating a condition in which the substrates are laid over with each other.

FIG. 15 is a front cross-sectional view illustrating a condition in which the respective central portions of the substrates 301, 302 abut with each other at the pressure that maintains a non-bonded condition by the Z-direction moving up-and-down driving mechanism 406, or in a condition in which, with the distance between the central portion of the substrate 301 and the central portion of the substrate 302 being maintained, the distance between the outer circumferential portion of the substrate 301 and that of the substrate 302 is reduced so as to lay over the substrates with each other.

In the bonding step S106, as illustrated in FIG. 15, the bonding surface of the substrate 301 and that of the substrate 302 are abutted with each other across the entirety of the bonding surfaces, and then those substrates are bonded together.

In this case, pressure may be applied to the bonding surfaces of the substrates 301, 302 in a condition in which those bonding surfaces are abutted with each other across the entirety of the bonding surfaces. The pressure to be applied with the bonding surfaces of the substrates 301, 302 being abutted with each other across the entirety of the bonding surfaces is preferably equal to or greater than the critical pressure or beyond the critical pressure. This prompts a further intimate contact between the bonding surfaces of the substrates 301, 302 in the final contacting step.

As for the pressurization with the bonding surfaces of the substrates 301, 302 being abutted with each other across the entirety of the bonding surfaces, pressure can be mechanically applied to the substrates 301, 302 using, for example, the mechanism like the Z-direction moving up-and-down driving mechanism 406 of the substrate bonding apparatus 100.

In addition, as for the pressurization with the bonding surfaces of the substrates 301, 302 being abutted with each other across the entirety of the bonding surfaces, by applying opposite charges to the substrates 301, 302, pressure may be electrically applied to the substrates 301, 302 utilizing the electrostatic attraction force by those charges.

The way, scheme, pressure, and the like, for the pressurization with the bonding surfaces of the substrates 301, 302 being abutted with each other across the entirety of the bonding surfaces are not limited to the above examples, and can be adjusted as appropriate in accordance with various specific substrate bonding methods.

In addition, in the bonding step S106, a step of applying heat to the bonding surfaces of the substrates 301, 302 in a condition being abutted with each other across the entirety of the bonding surfaces may be provided.

The bonding boundary that has desired characteristics can be formed by heating. The bonding boundary that has eventually the desired characteristics may be formed by heating. The diffusion of atoms around the bonding surfaces is promoted by heating, the unnecessary surface layer presenting on the surface of the bonding surface is eventually removed by diffusion, the bonding boundary to which the new surface directly contacts is formed, and the microscopic surface roughness is reduced. Hence, the substantial area of the bonding surface can be increased. This improves various characteristics of the bonding boundary, such as the mechanical characteristics, the electrical characteristics, and the chemical characteristics.

The heating can be performed simultaneously with the above pressurization. Alternatively, the heating and pressurization may be performed in such a way that the heating time and the pressurization time overlap partially or entirely. By simultaneously performing the heating and the pressurization, the diffusion of atoms around the bonding surface is further promoted, the characteristics of the bonding boundary to be obtained are improved, and the bonding process is further made effective.

When, for example, as explained above, with the bonding surfaces of the substrates 301, 302 being abutted with each other across the entirety of the bonding surfaces, by applying the opposite charges to the substrates 301, 302, the substrates 301, 302 may be electrically pressurized and heated utilizing the electrostatic attraction force by those charges. That is, a so-called anode bonding is accomplished.

The heating may be performed by transferring heat from the stages 401, 402 that support the substrates 301, 302, respectively, or by heating the ambient gas around the substrates 301, 302 to transfer the heat from the gas. Alternatively, the heating may be performed by emitting light or the like to the bonding surface.

As explained, by pressurizing and heating the bonding surfaces of both the substrates 301, 302, the final bonding boundary may be formed between both the substrates 301, 302. Both the substrates 301, 302 are excellently aligned with each other as explained above, and a final bonding is accomplished.

According to the above bonding method for the substrates 301, 302 and substrate bonding apparatus 100, the hydrophilization treatment step of causing water or an OH containing substance to adhere to the surface of the bonding surface of the substrate 301 and that of the substrate 302 is performed, a bowing step of disposing the substrates 301, 302 in such a way that the respective bonding surfaces face each other, and causing the central portion 301c of the substrate 301 to protrude toward the substrate 302 relative to the outer circumferential portion 301s of the bonding surface is performed, a step of aligning the bonding surface of the substrate 301 with the bonding surface of the substrate 302 at the respective central portions is performed, and the distance between the outer circumferential portion 301s of the substrate 301 and the outer circumferential portion 302s of the substrate 302 is decreased with the respective central portions abutting each other at the pressure that maintains the non-bonded condition, and the bonding surface of the substrate 301 and the bonding surface of the substrate 302 are bonded together so as to abut across the entirety of the bonding surfaces.

Hence, a production of voids between the wafers is prevented, and the highly precisely aligned bonding is enabled.

In addition, after the step of aligning the substrate 301 and the substrate 302 is executed, and before the substrates are bonded together, the atmosphere around the substrate 302 and the substrate 301 is vacuumed.

Accordingly, the step of aligning the substrate 301 and the substrate 302 is to be carried out under an ambient condition. In this case, when the bonding surface of the substrate 301 and that of the substrate 302 are abutted with each other via the respective central portions, the condition in which water molecules are present between the bonding surface of the substrate 301 and the bonding surface of the substrate 302 is maintained.

In this condition, since the water molecules are present between the bonding surfaces, no OH groups are coupled together, which does not affect the bonding surface, still enabling a separation of the substrates from each other.

If the step of abutting the bonding surface of the substrate 301 with that of the substrate 302 at the respective central portions is carried out under a vacuum condition, since no sufficient water molecules remain on the bonding surface, when the abutted substrates are separated from each other, the adverse effect acts on the bonding surface.

Hence, the alignment of the substrate 301 and the substrate 302 can be repeated without bonding the bonding surface of the substrate 301 with that of the substrate 302.

Conversely, when the bonding surface of the substrate 302 and that of the substrate 301 are abutted with each other across the entirety of the bonding surfaces, since the atmosphere around the bonding surface is vacuumed, mixing of air with water present between the bonding surface of the substrate 302 and that of the substrate 301 is prevented. Hence, a production of voids in the bonded portion between the substrate 302 and the substrate 301 is prevented. Consequently, the substrates are highly precisely aligned, while at the same time, a high quality bonding is accomplished.

In addition, as for the step of aligning the substrate 302 and the substrate 301, with the bonding surface of the substrate 302 and that of the substrate 301 being abut with each other via the respective central portions, the positional displacement between the substrate 302 and the substrate 301 is measured, and when the measured positional displacement exceeds the allowable error range, the relative position of the substrate 301 and that of the substrate 302 are adjusted so as to reduce the positional displacement between the substrate 302 and the substrate 301, and the measurement of the positional displacement between the substrate 301 and the substrate 302, and the adjustment of the relative position of the substrate 301 and that of the substrate 302 are repeated until the positional displacement falls in the allowable error range.

As explained above, by repeating until the positional displacement between the substrate 301 and the substrate 302 falls in the allowable error range, the substrate 301 and the substrate 302 are highly precisely aligned.

The step of measuring the positional displacement between the substrate 301 and the substrate 302 is carried out with the bonding surface of the substrate 301 and that of the substrate 302 being abutted with each other at a pressure or a time that enables the respective central portions to maintain the non-bonded condition.

When the substrate 301 and the substrate 302 are abutted with each other by excessive pressure, or are left for a long time, water present between the bonding surface of the substrate 301 and that of the substrate 302 is repelled, and the substrate 301 and the substrate 302 may be bonded together. Hence, by maintaining the pressure that enables the substrate 301 and the substrate 302 to maintain the non-bonded condition, in other words, the condition in which the water is present between the bonding surface of the substrate 301 and that of the substrate 302, the alignment of the substrate 301 and that of the substrate 302 can be performed smoothly.

In addition, in the step of abutting the bonding surface of the substrate with that of the substrate 302 across the entirety of the bonding surfaces, the substrate 301 in the planar shape is caused to abut the bonding surface of the substrate 302. By causing the bowed substrate 301 to be in a planar shape, the bonding surface of the substrate 301 and that of the substrate 302 can be easily bonded together in a manner abutted with each other across the entirety of the bonding surfaces.

In addition, in the step of abutting the bonding surface of the substrate 301 with that of the substrate 302 across the entirety of the bonding surfaces, by bonding the substrate 301 and the substrate 302 through pressurization, the bonding between the substrate 301 and the substrate 302 is surely accomplished.

According to an aspect of the present disclosure, in the above bonding method, the step of abutting the first substrate with the second substrate is to reduce the distance between the outer circumferential portion of the first substrate and that of the second substrate with the first substrate and the second substrate being abutted with each other at a pressure that maintains the non-bonded condition, and the bonding is performed with the bonding surface of the first substrate and that of the second substrate being abutted with each other across the entirety of the bonding surfaces.

In this case, when the bonding surface is too pressed, a strain is caused, and the positional precision of the entire substrate surface decreases. In addition, when only either one substrate is bowed, a strain may be caused during the bonding, but when both the substrates are bowed, a strain may be suppressed at the time of bonding.

In addition, by avoiding the pressurization up to the pressure of bonding the substrates together, the positional adjustment is still enabled.

Other Embodiments

The method for bonding the substrates together and the substrate bonding apparatus according to the present disclosure are not limited to the above respective embodiments explained with reference to the figures, and various modifications can be made within the scope of the present disclosure.

In the above embodiments, at least a part of the lower stage 401 may be formed of a transparent material, or the material of the lower stage 401 may be transparent. This enables light emitted from the light source for position measurement (including the above transmitted light and reflected) to pass through the transparent material of the lower stage 401. Hence, the design restriction on the substrate supporting means can be eliminated.

In the above embodiments, at least a part of the substrate heating means 420 may be formed of a transparent material, or the material of the substrate heating means 420 may be transparent, and the heater 421 in the substrate heating means 420 may have a predetermined pitch between the heater wiring portions.

This prevents the heater wiring portions from interfering with light emitted from the light source for position measurement (including the above transmitted light and reflected light). In addition, even if the heater wiring portions interfere with the light emitted from the light source in the initial setting stage, by rotating the substrate heating means 420 on which the heater 421 is mounted around the Z-axis, the heater wiring portions can be retracted from the optical path.

A preferable transparent material is a glass material or a ceramic material. The lower stage 401 may be formed of a material that allows light emitted from the light source to pass through even if such a material is not visually recognizable as transparent.

Still further, when at least a part of the lower stage 401 is formed of the transparent material, or the material of the lower stage 401 is transparent, at least a part of the substrate heating means 420 is formed of the transparent material, or the material of the substrate heating means 420 is transparent, and the heater 421 in the substrate heating means 420 has the predetermined pitch between the heater wiring portions, the design restriction on the substrate supporting means is eliminated.

For example, in the above embodiments, the explanation has been given of the example case in which the two stationary cameras 501, 502 are disposed as the position measuring means 500, but the present disclosure is not limited to this case, a single camera may be moved to pick up the respective images around the alignment markings at the two locations.

In addition, in the above embodiments, the explanation has been given of an example case in which the stage 401 is moved in the X direction, but the present disclosure is not limited to this case. For example, the stage 401 may be a stationary stage.

Still further, in the above embodiments, the explanation has been given of an example case in which, by moving the stages 402 in the X direction, the Y direction, the Z direction, and the θ direction, the stages 401, 402 are relatively moved in those directions, but the present disclosure is not limited to this case. For example, conversely, the stage 402 may be a stationary stage, and by moving the stage 401 in the X direction, the Y direction, the Z direction, and the θ direction, the stages 401, 402 may be relatively moved in those directions.

In the above embodiments, the substrates 301, 302 each in a predetermined shape or formed of a predetermined material, but the present disclosure is not limited to such a structure.

In the case of the substrate bonding apparatus 100 illustrated in FIG. 1, the surface activation treatment is performed thereinside, but the present disclosure is not limited to this structure. For example, the surface activation treatment may be performed outside the substrate bonding apparatus 100.

In addition, the surface activation treatment may be performed by simply opening the chamber 200 to reveal the interior thereof to the atmosphere.

Besides, the components explained in the above embodiments may be selectively adopted, or may be changed to the other structure as appropriate without departing from the scope of the present disclosure.

The present disclosure that covers the above embodiments has an advantageous effect to manufacturing of, for example, a CMOS sensor image, a memory, an arithmetic processing element, and an MEMS.

REFERENCE SIGNS LIST

100 Substrate bonding apparatus
200 Chamber
301 Substrate (second substrate)
302 Substrate (first substrate)
302c Central portion
302s Outer circumferential portion
304 Stage moving mechanism
400 Substrate supporting means
401 Stage (second substrate holder)
402 Stage (first substrate holder)
430 Protruding mechanism
431 Pressing plate (pressing member)
431c Central portion
431s Outer circumferential portion
440 Holder mechanism
500 Position measuring means (alignment unit)
600 Hydrophilization treatment means
700 Controller

The invention claimed is:

1. A method for bonding a first substrate and a second substrate, the method comprising:
a step of performing hydrophilization treatment to cause water or an OH containing substance to adhere to a bonding surface of the first substrate and a bonding surface of the second substrate;
a step of disposing the first substrate and the second substrate with the respective bonding surfaces facing each other, and bowing the first substrate in such a way that a central portion of the bonding surface protrudes toward the second substrate side relative to an outer circumferential portion of the bonding surface;
a step of bowing the second substrate in such a way that a central portion of the bonding surface protrudes toward the first substrate side relative to the outer circumferential portion of the bonding surface;
a first abutting step of abutting the bonding surface of the first substrate with the bonding surface of the second substrate at the respective central portions; and
a second abutting step of abutting the bonding surface of the first substrate with the bonding surface of the second substrate across an entirety of the bonding surfaces, decreasing a distance between an outer circumferential portion of the first substrate and an outer circumferential portion of the second substrate with the respective central portions abutting each other at a pressure that maintains a non-bonded condition,
wherein the second abutting step includes:
abutting the bonding surface of the first substrate with the bonding surface of the second substrate across the entirety of the bonding surfaces to bond the first substrate and the second substrate, decreasing the distance between the outer circumferential portion of the first substrate and the outer circumferential portion of the second substrate with distances from bottoms of the first substrate and the second substrate to the respective central portions being maintained.

2. The method according to claim 1, wherein
the first substrate is bowed by a first protruding mechanism in such a way that the central portion of the bonding surface protrudes toward the second substrate side relative to an outer circumferential portion of the bonding surface,
the second substrate is bowed by a second protruding mechanism in such a way that the central portion of the bonding surface protrudes toward the first substrate side relative to the outer circumferential portion of the bonding surface, and
one protruding mechanism of the first protruding mechanism and the second protruding mechanism is subjected to a pressure control, while the other of the first protruding mechanism and the second protruding mechanism has a numerically-controlled protruding distance.

3. The method according to claim 2, wherein a first substrate holder and a second substrate holder are caused to become closer to each other with distances from bottoms of the first substrate and the second substrate to the respective central portions being maintained.

4. The method according to claim 1, wherein at least the outer circumferential portion of either one or both of the first substrate and the second substrate is held.

5. The method according to claim 1, wherein the second abutting step includes:
abutting the opposing bonding surfaces of the first substrate and the second substrate with each other, with either one or both of the first substrate and the second substrate being flat.

6. The method according to claim 5, further comprising:
a step of bonding the first substrate and the second substrate after the second abutting step,
wherein the step of bonding includes pressing the first substrate and the second substrate against each other to bond the first substrate and the second substrate together.

7. The method according to claim 1, wherein
the second abutting step further includes:
decreasing the distance between the outer circumferential portion of the first substrate and the outer circumferential portion of the second substrate by causing a first substrate holder that holds a first substrate and a second substrate holder that holds a second substrate to become closer to each other.

8. A substrate bonding apparatus comprising:
a first substrate holder that holds a first substrate;
a second substrate holder that holds a second substrate with a bonding surface of the second substrate facing a bonding surface of the first substrate, the first substrate holder being located below the second substrate holder;
hydrophilization treatment means that causes water or an OH containing substance to adhere to the respective bonding surfaces of the first substrate and the second substrate;
a first protruding mechanism that bows the first substrate in such a way that a central portion of the bonding surface protrudes toward the second substrate side relative to an outer circumferential portion of the bonding surface;
a second protruding mechanism that bows the second substrate in such a way that a central portion of the bonding surface protrudes toward the first substrate side relative to an outer circumferential portion of the bonding surface; and a controller, wherein
the controller causes the bonding surface of the bowed first substrate and the bonding surface of the bowed second substrate to abut each other with (i) the first substrate being bowed by the first protruding mechanism in such a way that the central portion protrudes toward the second substrate side relative to the outer circumferential portion of the bonding surface and (ii) the second substrate being bowed by the second protruding mechanism in such a way that the central portion protrudes toward the first substrate side relative to the outer circumferential portion of the bonding surface, and causes the bonding surface of the first substrate and the bonding surface of the second substrate to abut each other across the entirety of the bonding surfaces, decreasing a distance between an outer circumferential portion of the first substrate and an outer circumferential portion of the second substrate with (i) distances from bottoms of the first substrate and the second substrate to the respective central portions being maintained and (ii) the respective central portions abutting each other at a pressure that maintains a non-bonded condition.

9. The substrate bonding apparatus according to claim 8, wherein one protruding mechanism of the first protruding mechanism and the second protruding mechanism is subjected to a pressure control, while the other protruding mechanism is an actuator that has a numerically-controlled protruding distance.

10. The substrate bonding apparatus according to claim 8, wherein the first substrate holder or the second substrate holder further comprises either one or both of a first substrate holder mechanism that holds the first substrate and a second substrate holder mechanism that holds the second substrate.

11. The substrate bonding apparatus according to claim 10, wherein the first substrate holder mechanism or the second substrate holder mechanism holds only the outer circumferential portion of the substrate.

12. The substrate bonding apparatus according to claim 10, wherein the first substrate holder mechanism or the second substrate holder mechanism is an electrostatic chuck.

13. The substrate bonding apparatus according to claim 10, wherein
the first substrate holder mechanism or the second substrate holder mechanism is a vacuum suction type or an electrostatic chuck, and
a suction groove or an electrostatic chuck of the substrate holder to hold a circumference portion of the first substrate is separate from a suction groove or an electrostatic chuck to hold the central portion of the substrate, and/or a suction groove or an electrostatic chuck of the substrate holder to hold a circumference portion of the second substrate is separate from a suction groove or an electrostatic chuck to hold the central portion of the second substrate.

14. The substrate bonding apparatus according to claim 8, further comprising an alignment unit that aligns the first substrate and the second substrate,
wherein the alignment unit aligns the first substrate and the second substrate before the bonding surface of the first substrate and the bonding surface of the second substrate abut each other across the entirety of the bonding surfaces to be bonded together.

15. The substrate bonding apparatus according to claim 8, wherein the first substrate holder further comprises a pressing member that forms a holding surface to hold the first substrate and that is bowed by the protruding mechanism in such a way that a central portion protrudes toward the second substrate side.

16. The substrate bonding apparatus according to claim 8, further comprising a chamber in which a vacuum is drawn in the atmosphere around the first substrate and around the second substrate.

17. The substrate bonding apparatus according to claim 8, wherein when the bonding surface of the first substrate and the bonding surface of the second substrate are to abut each other across the entirety of the bonding surfaces, the opposing bonding surfaces of the first substrate and the second substrate abut each other with either one or both of the first substrate and the second substrate being flat.

18. The method according to claim 1, wherein
the first substrate and the second substrate are caused to be in a planar shape with distances from bottoms of the first substrate and the second substrate to the respective central portions being maintained.

19. The method according to claim 1, wherein
the first substrate is held by a first substrate holder mechanism,
the second substrate is held by a second substrate holder mechanism, and
the first substrate holder mechanism or the second substrate holder mechanism is an electrostatic chuck.

20. The method according to claim 1, wherein
the first substrate is held by a first substrate holder mechanism,
the second substrate is held by a second substrate holder mechanism, and
the first substrate holder mechanism or the second substrate holder mechanism is a vacuum suction type or an electrostatic chuck, and
a suction groove or an electrostatic chuck of the substrate holder to hold a circumference portion of the first substrate is separate from a suction groove or an electrostatic chuck to hold the central portion of the substrate, and/or a suction groove or an electrostatic chuck of the substrate holder to hold a circumference portion of the second substrate is separate from a suction groove or an electrostatic chuck to hold the central portion of the second substrate.

21. The substrate bonding apparatus according to claim 8, wherein a first substrate holder and a second substrate holder are caused to become closer to each other with distances from bottoms of the first substrate and the second substrate to the respective central portions being maintained.

22. The substrate bonding apparatus according to claim 8, wherein the first substrate and the second substrate are caused to be in a planar shape with distances from bottoms of the first substrate and the second substrate to the respective central portions being maintained.

23. The substrate bonding apparatus according to claim 8, wherein the controller causes the bonding surface of the bowed first substrate and the bonding surface of the second substrate to abut each other with the first substrate being bowed by the first protruding mechanism in such a way that the central portion protrudes relative to the outer circumferential portion of the bonding surface, and causes the bonding surface of the first substrate and the bonding surface of the second substrate to abut each other across the entirety of the bonding surfaces, decreasing a distance between an outer circumferential portion of the first substrate and an outer circumferential portion of the second substrate with the respective central portions abutting each other at a pressure that maintains a non-bonded condition.

* * * * *